United States Patent
Huh et al.

(10) Patent No.: US 10,522,762 B2
(45) Date of Patent: Dec. 31, 2019

(54) ORGANIC LIGHT EMITTING DIODE INCLUDING AN ORGANIC LAYER HAVING A COMPOUND WITH AT LEAST A NITROGEN-CONTAINING HETERORING GROUP

(71) Applicant: LG Chem, LTD., Seoul (KR)

(72) Inventors: Jungoh Huh, Daejeon (KR); Dong Hoon Lee, Daejeon (KR); Wonjoon Heo, Daejeon (KR)

(73) Assignee: LG CHEM, LTD., Seoul (KR)

(*) Notice: Subject to any disclaimer, the term of this patent is extended or adjusted under 35 U.S.C. 154(b) by 32 days.

(21) Appl. No.: 15/516,516

(22) PCT Filed: Jul. 7, 2015

(86) PCT No.: PCT/KR2015/007010
§ 371 (c)(1),
(2) Date: Apr. 3, 2017

(87) PCT Pub. No.: WO2016/080622
PCT Pub. Date: May 26, 2016

(65) Prior Publication Data
US 2018/0269402 A1    Sep. 20, 2018

(30) Foreign Application Priority Data

Nov. 20, 2014  (KR) .................. 10-2014-0162927
Dec. 18, 2014  (KR) .................. 10-2014-0183559

(51) Int. Cl.
*H01L 51/00* (2006.01)
*C09K 11/06* (2006.01)
*H01L 51/50* (2006.01)

(52) U.S. Cl.
CPC .......... *H01L 51/0067* (2013.01); *C09K 11/06* (2013.01); *H01L 51/0058* (2013.01); *H01L 51/0061* (2013.01); *H01L 51/0072* (2013.01); *H01L 51/0074* (2013.01); *H01L 51/5004* (2013.01); *H01L 51/5012* (2013.01);
(Continued)

(58) Field of Classification Search
None
See application file for complete search history.

(56) References Cited

U.S. PATENT DOCUMENTS 8,580,391 B2 * 11/2013 Iwakuma ............. C07D 401/10
                                                         257/E51.05
9,847,501 B2 * 12/2017 Mizutani ............. C07D 519/00
(Continued)

FOREIGN PATENT DOCUMENTS

EP    3192847 A1    7/2017
JP    2004-71380    3/2004
(Continued)

OTHER PUBLICATIONS

OLED and PLED Materials, Sigma Aldrich Feb. 15, 2014 downloaded from URL<https://web.archive.org/web/20140215101521/https://www.sigmaaldrich.com/materials-science/material-science-products.html?TablePage=19353440> on Sep. 25, 2018.*
(Continued)

*Primary Examiner* — J. E. Schoenholtz
(74) *Attorney, Agent, or Firm* — Dentons US LLP

(57) ABSTRACT

The present specification relates to an organic light emitting diode.

10 Claims, 1 Drawing Sheet

(52) U.S. Cl.
CPC ...... *H01L 51/5056* (2013.01); *H01L 51/5072* (2013.01); *H01L 51/5088* (2013.01); *H01L 51/5092* (2013.01); *H01L 51/5096* (2013.01); *H01L 2251/55* (2013.01); *H01L 2251/552* (2013.01)

(56) References Cited

U.S. PATENT DOCUMENTS

| | | | | |
|---|---|---|---|---|
| 10,003,030 | B2* | 6/2018 | Lee | C07D 493/04 |
| 2002/0055014 | A1* | 5/2002 | Okada | C09K 11/06 |
| | | | | 428/690 |
| 2011/0095282 | A1 | 4/2011 | Pflumm et al. | |
| 2012/0223276 | A1* | 9/2012 | Parham | C07D 403/10 |
| | | | | 252/500 |
| 2013/0248830 | A1 | 9/2013 | Welsh et al. | |
| 2014/0001456 | A1* | 1/2014 | Mizutani | C07D 405/14 |
| | | | | 257/40 |
| 2014/0209884 | A1 | 7/2014 | Park et al. | |
| 2015/0349268 | A1* | 12/2015 | Zeng | H01L 51/0067 |
| | | | | 257/40 |
| 2016/0181538 | A1* | 6/2016 | Ludemann | H01L 51/0035 |
| | | | | 257/40 |
| 2016/0197282 | A1* | 7/2016 | Tanimoto | H01L 51/0057 |
| | | | | 257/40 |
| 2016/0218298 | A1 | 7/2016 | Lee et al. | |
| 2017/0077418 | A1* | 3/2017 | Stoessel | H01L 51/0054 |
| 2017/0358760 | A1* | 12/2017 | Stoessel | C09K 11/06 |

FOREIGN PATENT DOCUMENTS

| | | | |
|---|---|---|---|
| JP | 2009-21336 | 1/2009 | |
| JP | 2009021336 A * | 1/2009 | ............ H01L 51/50 |
| JP | 2012-82136 | 4/2012 | |
| KR | 10-2014-0009918 | 1/2014 | |
| KR | 10-2014-0125061 | 10/2014 | |
| KR | 20140125061 A * | 10/2014 | |
| WO | 2013/191429 | 12/2013 | |

OTHER PUBLICATIONS

Im, Yirang, et al. "Molecular Design Strategy of Organic Thermally Activated Delayed Fluorescence Emitters." Chemistry of Materials, vol. 29, No. 5, 2017, pp. 1946-1963., doi:10.1021/acs.chemmater.6b05324.*

Sathiyan, Govindasamy, and Pachagounder Sakthivel. "Synthesis and Characterization of Triazine Linked Carbazole Derivatives Green-Light-Emitting Molecules." Dyes and Pigments, vol. 143, 2017, pp. 444-454., doi:10.1016/j.dyepig.2017.04.065.*

Rothmann, Michael, "Designing Novel Host Materials for Blue Phosphorescent Organic Light Emitting Diodes" Dissertation in Department of Chemistry and Biology, University of Bayreuth, Germany, 2009.*

Li, Yunchuan, et al. "Recent Advancements of High Efficient Donor—Acceptor Type Blue Small Molecule Applied for OLEDs." Materials Today, vol. 20, No. 5, 2017, pp. 258-266., doi:10.1016/j.mattod.2016.12.003.*

Jeong, Hyocheol, et al. "Recent Progress in the Use of Fluorescent and Phosphorescent Organic Compounds for Organic Light-Emitting Diode Lighting." Journal of Photonics for Energy, vol. 5, No. 1, 2015, p. 057608., doi:10.1117/1.jpe.5.057608.*

Machine translation of JP 2009021336 A.*

Machine Translation of KR 10 2014 0125061 (Year: 2014).*

R.A. Marcus, "On the Theory of Oxydation-Reduction Reactions Involving Electron Transfer. I", J.Chem.Phys., vol. 24, No. 5, pp. 966-978, May 1956.

* cited by examiner

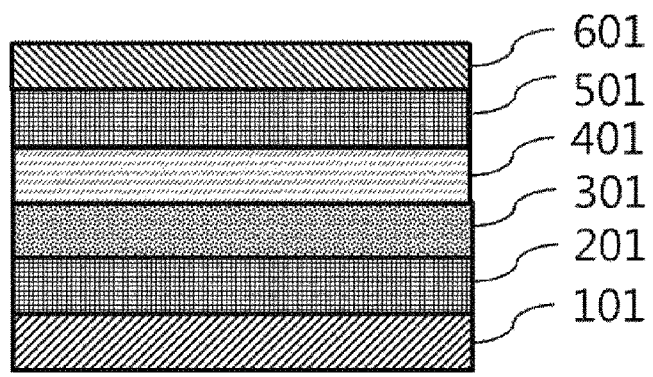

ORGANIC LIGHT EMITTING DIODE INCLUDING AN ORGANIC LAYER HAVING A COMPOUND WITH AT LEAST A NITROGEN-CONTAINING HETERORING GROUP

This application is a National Stage Entry of International Application No. PCT/KR2015/007010, filed Jul. 7, 2015, and claims the benefit of and priority to Korean Application Nos. 10-2014-0162927, filed Nov. 20, 2014 and 10-2014-0183559, filed Dec. 18, 2014, all of which are hereby incorporated by reference in their entirety for all purposes as if fully set forth herein.

TECHNICAL FIELD

The present specification claims priority to and the benefits of Korean Patent Application No. 10-2014-0162927, filed with the Korean Intellectual Property Office on Nov. 20, 2014, and Korean Patent Application No. 10-2014-0183559, filed with the Korean Intellectual Property Office on Dec. 18, 2014, the entire contents of which are incorporated herein by reference.

The present specification relates to an organic light emitting diode.

BACKGROUND ART

An organic light emission phenomenon is one of the examples converting current to visible light by an internal process of a specific organic molecule. The principle of an organic light emission phenomenon is as follows.

When an organic material layer is placed between an anode and a cathode and a voltage is applied between the two electrodes, electrons and holes are injected to the organic material layer from the cathode and the anode, respectively. The electrons and the holes injected to the organic material layer are recombined to form excitons, and light emits when these excitons fall back to the ground state. An organic light emitting diode using such a principle is generally formed with a cathode, an anode, and an organic material layer placed therebetween, which includes, for example, a hole injection layer, a hole transfer layer, a light emitting layer and an electron transfer layer.

Materials used in organic light emitting diodes are mostly pure organic materials or complex compounds in which organic materials and metals form complexes, and may be divided into hole injection materials, hole transfer materials, light emitting materials, electron transfer materials, electron injection materials and the like. Herein, as the hole injection material or the hole transfer material, organic materials having a p-type property, that is, readily oxidized and electrochemically stable when oxidized, are generally used. Meanwhile, as the electron injection material or the electron transfer material, organic materials having an n-type property, that is, readily reduced and electrochemically stable when reduced, are generally used. As the light emitting layer material, materials having both a p-type property and an n-type property, that is, having a stable form in both oxidized and reduced states, are preferable, and materials having high light emission efficiency converting, when excitons are formed, the excitons to light are preferable.

Accordingly, the development of organic light emitting diodes having high efficiency has been required in the art.

PRIOR ART DOCUMENTS

Non-Patent Documents

J. Chem. Phys. 24, 966(1956)

DISCLOSURE

Technical Problem

An object of the present specification is to provide an organic light emitting diode having high light emission efficiency.

Technical Solution

The present specification provides an organic light emitting diode including an anode; a cathode; a light emitting layer provided between the anode and the cathode; and an organic material layer provided between the cathode and the light emitting layer, wherein the light emitting layer includes a fluorescent dopant, and the organic material layer provided between the cathode and the light emitting layer includes a compound satisfying the following Equation 1.

$$0\ eV < \lambda_- - \lambda_+ < 0.3\ eV \quad \text{[Equation 1]}$$

In Equation 1, $\lambda_-$ means a reorientation energy value of an anion radical, and $\lambda_+$ means a reorientation energy value of a cation radical.

Advantageous Effects

An organic light emitting diode according to one embodiment of the present specification provides a low driving voltage and/or high efficiency.

An organic light emitting diode according to one embodiment of the present specification is capable of providing a device having a simple structure without using a separate hole blocking layer, and thereby has economic benefits in terms of costs and/or time.

In addition, an organic light emitting diode according to one embodiment of the present specification provides an organic light emitting diode having a long lifespan.

DESCRIPTION OF DRAWINGS

FIG. 1 is a diagram showing an organic light emitting diode according to one embodiment of the present specification.

REFERENCE NUMERAL

101: Substrate
201: Anode
301: Hole Transfer Layer
401: Light Emitting Layer
501: Electron Transfer Layer
601: Cathode.

MODE FOR DISCLOSURE

Hereinafter, the present specification will be described in more detail.

In the present specification, a description of one member being placed "on" another member includes not only a case of the one member adjoining another member but a case of still another member being present between the two members.

In the present specification, a description of a certain part "including" certain constituents means capable of further including other constituents, and does not exclude other constituents unless particularly stated on the contrary.

An organic light emitting diode according to one embodiment of the present specification includes an organic material layer including a compound satisfying a value of Equation 1. The value of Equation 1 means a difference between a reorientation energy value of an anion radical and a reorientation energy value of a cation radical.

Reorientation energy may mean a barrier in a charge transfer process, and may become a factor determining a transfer amount of charges per unit time.

A process of electron transfer between the same molecules is as follows.

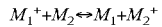

$$M_1^+ + M_2 \leftrightarrow M_1 + M_2^+$$

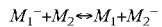

$$M_1^- + M_2 \leftrightarrow M_1 + M_2^-$$

$\lambda_-$ and $\lambda_+$ values that are reorientation energy of an anion radical and reorientation energy of a cation radical, which are energy barriers when hole or electron transfer occurs as above, may be obtained by the following Equation 3 and Equation 4, respectively.

$$\lambda_- = \{E_{anion}^X - E_{anion}^{X-}\} + \{E_{neutral}^{X-} - E_{neutral}^X\} \quad \text{[Equation 3]}$$

$$\lambda_+ = \{E_{cation}^X - E_{cation}^{X+}\} + \{E_{neutral}^{X+} - E_{neutral}^X\} \quad \text{[Equation 4]}$$

In Equation 3 and Equation 4,
$E_{geometry}^{charge}$ means energy that charges are 0, $X^+$ or $X^-$ in a structure of which geometry is optimized as a cation, an anion or neutral.

Specifically, the reorientation energy value ($\lambda_-$) of the anion radical may be shown as a sum of energy ($\{E_{anion}^X - E_{anion}^{X-}\}$) when an anion ($M_1^-$) molecule stabilized as an anion structure is oxidized to a neutral ($M_1$) and energy ($\{E_{neutral}^{X-} - E_{neutral}^X\}$) when a neutral ($M_2$) molecule stabilized as a neutral structure is reduced to an anion ($M_2^-$).

In addition, a reorientation energy value ($\lambda_+$) of a cation radical may be shown as a sum of energy ($\{E_{cation}^X - E_{cation}^{X+}\}$) when a cation ($M_1^+$) molecule stabilized as a cation structure is oxidized to a neutral ($M_1$) and energy ($\{E_{neutral}^{X+} - E_{neutral}^X\}$) when a neutral ($M_2$) molecule stabilized as a neutral structure is oxidized to a cation ($M_2^+$).

In calculating the reorientation energy in the present specification, optimization of the molecular structure and calculation of each energy are carried out by a density functional theory (DFT) using BPW91 function and dnd basis function with Dmol3, a quantum chemistry calculation program of BIOVIA (former Accelrys).

An organic light emitting diode according to one embodiment of the present specification includes an organic material layer in which the value of Equation 1 satisfies a value greater than 0 and less than 0.3.

An organic light emitting diode according to one embodiment of the present specification emits blue fluorescent light.

In one embodiment of the present specification, the light emitting layer includes a peak wavelength of an optical emission spectrum of 550 nm or less. In one specific embodiment, the light emitting layer includes a peak wavelength of an optical emission spectrum of 430 nm to 550 nm.

In the present specification, the peak wavelength means a wavelength at the maximum of spectrum distribution.

In existing technologies, organic materials having a reductive acceptor (n-type) property, that is, organic materials readily reduced and electrochemically stable when reduced have been normally used as an electron transfer material. In the materials used in existing technologies, the reorientation energy value of an anion radical is smaller than the reorientation energy value of a cation radical due to a reductive property as described above, therefore, the value of Equation 1 is negative.

The compound satisfying Equation 1 according to one embodiment of the present specification has a positive value, but has a bipolar type having a reductive acceptor (n-type) and a oxidative structure (p-type structure) not leaning to a property of a p-type structure, and therefore, is stable in both oxidized and reduced states. Accordingly, when excitons are formed, an effect of high light emission efficiency converting the excitons to light may be obtained.

In addition, satisfying the value of Equation 1 of the present specification means that, in electron transfer from a cathode, an energy barrier to overcome becomes larger than an existing electron transfer material leaning to a reductive acceptor (n-type), and therefore, the amount of electrons passing to a light emitting layer decreases.

Organic light emitting diodes currently used in the art are used as a combination of blue fluorescence, green and red phosphorescence, or a combination of blue fluorescence and green fluorescence and red phosphorescence, and the like.

However, in the case of such a device combination, a light emitting region is generally leaning toward an interface side of a hole transfer layer and a light emitting layer, and therefore, an organic light emitting diode emitting blue fluorescent light having high exciton energy has a problem in that a lifespan of the device significantly decreases compared to green or red relatively. In other words, high exciton energy of blue fluorescence is centered on a local region of a narrow light emitting region, and therefore, energy stress given to the material increases eventually leading to a low lifespan.

In existing technologies, in order to solve such a problem, attempts to enhance efficiency and a lifespan of an organic light emitting diode have been made by having, other than an electron transfer layer, a separate hole blocking layer including an organic compound having high ionization potential in a light emitting layer and an electron transfer layer and artificially controlling the amount of electrons. However, a driving voltage increase becomes a problem since hole accumulation is used, and it is uneconomical in terms of time and costs since two or more electron transfer layers need to be used other than a hole blocking layer.

When the value of Equation 1 according to one embodiment of the present specification is greater than 0, efficiency of an organic light emitting diode may increase without having a hole blocking layer by controlling the amount of electrons transferred from a cathode to a light emitting layer using a charge barrier that molecules themselves have. However, when the value of Equation 1 becomes too large, an energy barrier to overcome in electron transfer from a cathode becomes too high causing the amount of electrons transferred to the light emitting layer becoming too small, and this may decrease the formation of excitons made by the encounter of the hole-electron pair and thereby may decrease efficiency of the organic light emitting diode. In addition, when the value of Equation 1 is greater than 0.3, excitons may form at an interface of an electron transfer layer, which may cause a problem in the lifespan of a device due to a stability problem of the electron transfer layer itself.

Accordingly, the compound satisfying Equation 1 may maintain high efficiency of an organic light emitting diode without having a separate hole blocking layer by controlling the amount of electrons transferred from a cathode to a light emitting layer. In addition, the compound satisfying Equation according to one embodiment of the present specification induces the formation of excitons in a light emitting layer instead of at an interface of a hole transfer layer and the light emitting layer by controlling the amount of electrons transferred to a light emitting layer, and as a result, may increase the lifespan of an organic light emitting diode.

Therefore, according to one embodiment of the present specification, an organic light emitting diode having high efficiency and/or a long lifespan may be provided when an organic material layer including the compound satisfying Equation 1 is provided between a light emitting layer and a cathode.

In one embodiment of the present specification, the compound satisfying Equation 1 has an ionization potential value of greater than or equal to 5.5 eV and less than 6.5 eV.

According to one embodiment of the present specification, when the compound satisfying Equation 1 has a value in the above-mentioned ionization potential range, an ionization potential difference between an electron transfer layer and a light emitting layer is appropriate, and it is possible to perform a hole blocking role while minimizing the accumulation of holes at an interface of the electron transfer layer during the driving of an organic light emitting diode.

In one embodiment of the present specification, the organic light emitting diode satisfies the following Equation 2.

$$|\Delta IP| < 0.5 \text{ eV} \qquad \text{[Equation 2]}$$

In Equation 2, $\Delta IP$ means a difference between an ionization potential value of the compound satisfying Equation 1 and an ionization potential value of a host material of the light emitting layer.

The difference between ionization potential of a host material forming the light emitting layer and ionization potential of the compound satisfying Equation 1 ($\Delta IP = IP$ (compound satisfying Equation 1)–IP (host material of light emitting layer)) is preferably $-0.5 \text{ eV} < \Delta IP < 0.5 \text{ eV}$. According to one embodiment of the present specification, when $\Delta IP$ is in the above-mentioned range, accumulation of holes due to a difference between ionization potential of the light emitting layer and an organic material layer including the compound satisfying Equation 1 may be avoided, and a voltage increase may be suppressed, and at the same time, the role of hole-blocking is carried out, which leads to prevention of an efficiency and lifespan decrease caused by the leaks of the holes.

In the present specification, the ionization potential is measured by irradiating light (excitation light) of deuterium lamp separated with a monochromator on a material, measuring photoelectron release using an electrometer, and calculating a threshold value of the photoelectron release from an irradiation photon energy curve of the obtained photoelectron release using extrapolation. An ultraviolet photoelectron spectroscopy instrument AC-3 (product of RIKEN KEIKI LTD. CO) in atmosphere is used as a measuring device.

In one embodiment of the present specification, electron mobility of the compound satisfying Equation 1 is $10^{-7}$ cm$^2$/Vs or greater under an electric field condition of 0.1 MV/cm. In one embodiment of the present specification, electron mobility of the compound satisfying Equation 1 is greater than or equal to $10^{-7}$ cm$^2$/Vs and less than or equal to $10^2$ cm$^2$/Vs under an electric field condition of 0.1 MV/cm.

In one embodiment of the present specification, hole mobility of the compound satisfying Equation 1 is $10^{-7}$ cm$^2$/Vs or greater under an electric field condition of 0.1 MV/cm. In one embodiment of the present specification, hole mobility of the compound satisfying Equation 1 is greater than or equal to $10^{-7}$ cm$^2$/Vs and less than or equal to $10^2$ cm$^2$/Vs under an electric field condition of 0.1 MV/cm.

According to one embodiment of the present specification, when electron mobility of the compound satisfying Equation 1 and/or hole mobility of the compound satisfying Equation 1 satisfy the above-mentioned range, light emission efficiency is excellent since the amount of holes and/or electrons transferred to a light emitting layer is appropriate, and the location of exciton formation is readily controlled in the light emitting layer.

Electron mobility and hole mobility may be measured using methods used in the art. Specifically, a time of flight (TOF) method or a space charge limited current (SCLC) method may be used, however, the method is not limited thereto.

In the present specification, hole mobility may be measured using methods used in the art. Specifically, a time of flight (TOF) method or a space charge limited current (SCLC) method may be used, however, the method is not limited thereto.

In one embodiment of the present specification, charge mobility of the compound represented by Equation 1 measured using a time of flight (TOF) method is $10^{-7}$ cm$^2$/Vs or greater.

In the present specification, charge mobility may be measured with the film thickness of a material to be 1000 nm or greater in order to measure space charge limited current (SCLC).

Specifically, in one embodiment of the present specification, bathophenanthroline and lithium quinolate (2%) are deposited on an ITO substrate to a thickness of 100 nm by being heated under vacuum, and then the compound satisfying Equation 1 is deposited to a thickness of 200 nm. On this layer, bathophenanthroline and lithium quinolate (2%) are deposited again to a thickness of 100 nm, and then aluminum is deposited to thickness of 100 nm or greater, and as a result, a sample is prepared. Electron mobility in a space charge limited current (SCLC) region may be calculated by measuring currently density (mA/cm$^2$) of the sample with respect to a voltage.

In addition, after hexanitrilehexaazatriphenylene is deposited on an ITO substrate to a thickness of 5 nm by being heated under vacuum, the compound satisfying Equation 1 is deposited to a thickness of 200 nm, and then aluminum is deposited to a thickness of 100 nm or greater to prepare a sample. Hole mobility in a space charge limited current (SCLC) region may be calculated by measuring currently density (mA/cm$^2$) of the sample with respect to a voltage.

In one embodiment of the present specification, an organic material layer including the compound satisfying Equation 1 is an electron transfer layer, an electron injection layer, or a layer carrying out electron transfer and electron injection at the same time.

According to one embodiment of the present specification, an organic material layer including the compound satisfying Equation 1 is an electron transfer layer.

According to another embodiment of the present specification, an organic material layer including the compound satisfying Equation 1 is an electron injection and electron transfer layer. Specifically, when an electron injection layer is not provided in an organic light emitting diode according to one embodiment of the present specification, an organic material layer including the compound satisfying Equation 1 may simultaneously carry out roles of an electron injection layer and an electron transfer layer.

In addition, according to another embodiment of the present specification, the organic light emitting diode may include only an organic material layer including the compound satisfying Equation 1 between a cathode and a light emitting layer. In another embodiment, the organic light emitting diode may further include an additional organic material layer between a cathode and an organic material layer including the compound satisfying Equation 1; or between a light emitting layer and an organic material layer including the compound satisfying Equation 1.

In one embodiment of the present specification, an organic material layer including the compound satisfying Equation 1 is provided adjoining the light emitting layer. In this case, electrons transferred from a cathode to the light emitting layer may be more effectively controlled. Specifically, in one embodiment of the present specification, the light emitting layer provided adjoining an organic material layer including the compound satisfying Equation 1 includes a peak wavelength of an optical emission spectrum of 550 nm or less.

In one embodiment of the present specification, the organic light emitting diode may include two or more light emitting layers. In this case, the light emitting layer most adjacent to an organic material layer including the compound satisfying Equation 1 includes a peak wavelength of an optical emission spectrum of 550 nm or less, and the remaining light emitting layers may include other peak wavelengths.

In the present specification, a most adjacent light emitting layer means a light emitting layer physically closest to an organic material layer including the compound satisfying Equation 1 among a plurality of light emitting layers, and may mean not only a light emitting layer provided adjoining the organic material layer including the compound satisfying Equation 1 but also a case including an additional organic material layer between the organic material layer including the compound satisfying Equation 1 and a light emitting layer.

In the present specification, the organic light emitting diode preferably includes two or more light emitting layers, and the light emitting layer provided adjoining an organic material layer including the compound satisfying Equation 1 includes a peak wavelength of an optical emission spectrum of 550 nm or less.

Examples of the substituents in the present specification are described below, however, the substituents are not limited thereto.

The term "substitution" means a hydrogen atom bonding to a carbon atom of a compound is changed to another substituent, and the position of substitution is not limited as long as it is a position at which a hydrogen atom is substituted, that is, a position at which a substituent may substitute, and when two or more substituents substitute, the two or more substituents may be the same as or different from each other.

The term "substituted or unsubstituted" in the present specification means being substituted with one, two or more substituents selected from the group consisting of deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted alkenyl group; a substituted or unsubstituted amine group; a substituted or unsubstituted aryl group; and a substituted or unsubstituted heteroring group, or being substituted with a substituent linking two or more substituents of the substituents illustrated above, or having no substituents. For example, "a substituent linking two or more substituents" may include a biphenyl group. In other words, a biphenyl group may be interpreted as an aryl group, or as a substituent linking two phenyl groups.

An organic group in the present specification may include an alkyl group, an alkenyl group, a cycloalkyl group, a cycloalkenyl group, an aryl group, an aralkyl group and the like. This organic group may include a bond or a substituent other than a hydrocarbon group such as a heteroatom in the organic group. In addition, the organic group may have any of a linear form, a branched form or a cyclic form.

A monovalent organic group in the present specification means a monovalent group having one bonding site in an organic compound.

In addition, the organic group may form a cyclic structure, and may form a bond including a heteroatom as long as it does not impair the effects of the invention.

Specifically, a bond including a heteroatom such as an oxygen atom, a nitrogen atom and a silicon atom may be included. As specific examples, a cyano bond, an ether bond, a thioether bond, a carbonyl bond, a thiocarbonyl bond, an ester bond, an amide bond, an urethane bond, an imino bond ($N=C(-A)-$, $-C(=NA)-$: A represents a hydrogen atom or an organic group), a carbonate bond, a sulfonyl bond, a sulfinyl bond, an azo bond and the like may be included, however, the examples are not limited thereto.

The cyclic structure may include an aromatic ring, an aliphatic ring and the like described above, and may be monocyclic or multicyclic.

In the present specification, the alkyl group may be linear or branched, and the number of carbon atoms is not particularly limited, but is preferably 1 to 50. Specific examples thereof include a methyl group, an ethyl group, a propyl group, an isopropyl group, a butyl group, a t-butyl group, a pentyl group, a hexyl group, a heptyl group and the like, but are not limited thereto.

In the present specification, the alkenyl group may be linear or branched, and although not particularly limited thereto, the number of carbon atoms is preferably 2 to 40. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group and the like, but are not limited thereto.

In the present specification, the cycloalkyl group is not particularly limited, but preferably has 3 to 60 carbon atoms, and particularly, a cyclopentyl group, a cyclohexyl group and the like are included. However, the examples are not limited thereto.

In the present specification, the amine group may be selected from the group consisting of $-NH_2$; an alkylamine group; an aralkylamine group; an arylamine group; and a heteroarylamine group, and although not particularly limited thereto, the number of carbon atoms is preferably 1 to 30. Specific examples of the amine group include a methylamine group, a dimethylamine group, an ethylamine group, a diethyl amine group, a phenylamine group, a naphthylamine group, a biphenylamine group, an anthracenylamine group, a 9-methyl-anthracenylamine group, a diphenylamine group, a phenylnaphthylamine group, a ditolylamine group, a phenyltolylamine group, a triphenylamine group and the like, but are not limited thereto.

When the aryl group is a monocyclic aryl group, the number of carbon atoms is not particularly limited, but is preferably 6 to 25. Specific examples of the monocyclic aryl group may include a phenyl group, a biphenyl group, a terphenyl group and the like, but are not limited thereto.

When the aryl group is a multicyclic aryl group, the number of carbon atoms is not particularly limited, but is preferably 10 to 24. Specific example of the multicyclic aryl group may include a naphthyl group, a triphenylenyl group, an anthracenyl group, a phenanthryl group, a pyrenyl group, a perylenyl group, a crycenyl group, a fluorenyl group and the like, but are not limited thereto.

In the present specification, the fluorenyl group may be substituted, and adjacent substituents may bond to each other to form a ring.

When the fluorenyl group is substituted,

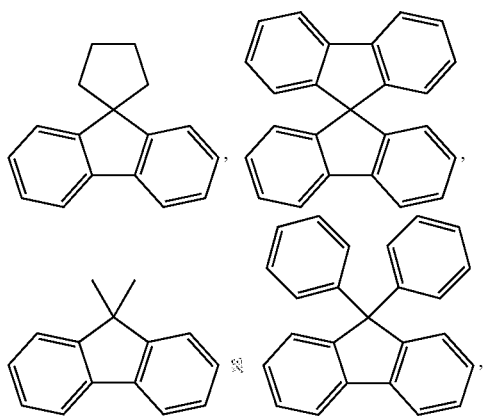

and the like may be included. However, the structure is not limited thereto.

In the present specification, the heteroring group is a group including one or more atoms that are not carbon, that is, heteroatoms, and specifically, the heteroatom may include one or more atoms selected from the group consisting of O, N, Se, S and the like. The number of carbon atoms is not particularly limited, but is preferably 2 to 60. Examples of the heteroring group include a thiophene group, a furan group, a pyrrole group, an imidazole group, a triazole group, an oxazole group, an oxadiazole group, a pyridyl group, a bipyridyl group, a pyrimidyl group, a triazine group, a triazole group, an acridyl group, a pyridazine group, a pyrazinyl group, a qinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a benzothiazolyl group, a phenothiazinyl group, a dibenzofuranyl group and the like, but are not limited thereto.

The heteroring group may be monocyclic or multicyclic, and may be aromatic, aliphatic, or a fused ring of aromatic and aliphatic.

In the present specification, an arylene group means an aryl group having two bonding sites, that is, a divalent group. Descriptions on the aryl group made above may be applied except that these are a divalent group.

The hydrocarbon ring in the present specification may be aliphatic, aromatic, or a fused ring of aliphatic and aromatic, and may be selected among the examples of the cycloalkyl group or the aryl group except for those that are not monovalent. The heteroring may be aliphatic, aromatic, or a fused ring of aliphatic and aromatic, and may be selected among the examples of the heteroring group except for those that are not monovalent.

In one embodiment of the present specification, the compound satisfying Equation 1 includes at least a nitrogen-containing heteroring group.

The nitrogen-containing heteroring group of the present specification may function as an n-type structure in the compound satisfying Equation 1.

The nitrogen-containing heteroring group in the present specification may be a 5-membered ring or a 6-membered ring, and the ring including a 5-membered ring or a 6-membered ring may be monocylic or multicyclic.

In one embodiment of the present specification, the nitrogen-containing heteroring group has any one of the following structures.

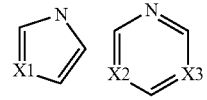

X1 to X3 are each N or CR,

R is a monovalent organic group, and a hydrocarbon ring or a heteroring may be fused to the above-mentioned structure.

In the present specification, a hydrocarbon ring or a heteroring being fused may mean the hydrocarbon ring or the heteroring bonds to the above-mentioned structure to form a multicyclic ring.

In one embodiment of the present specification, the nitrogen-containing heteroring group has any one of the following structures.

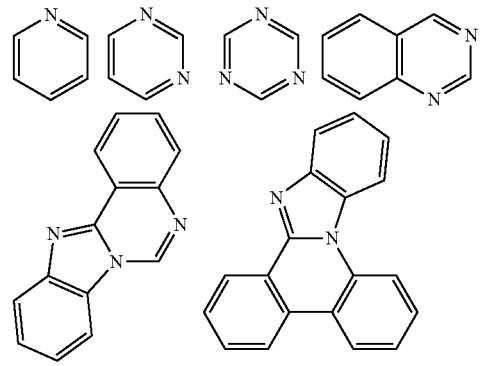

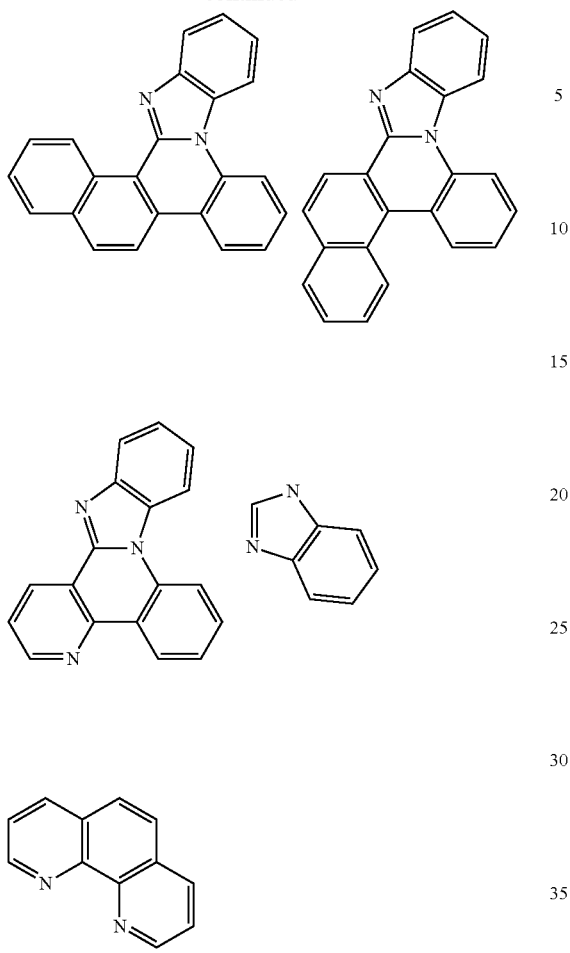

The structures may be unsubstituted or substituted with one, two or more substituents selected from the group consisting of deuterium; a substituted or unsubstituted alkyl group; a substituted or unsubstituted aryl group; and a substituted or unsubstituted heteroring group.

In one embodiment of the present specification, the compound satisfying Equation 1 has a p-type structure. A p-type structure in the present specification means a substituent readily oxidized and electrochemically stable when oxidized, and may mean an oxidative donor.

In one embodiment of the present specification, the p-type structure is any one of the following structures.

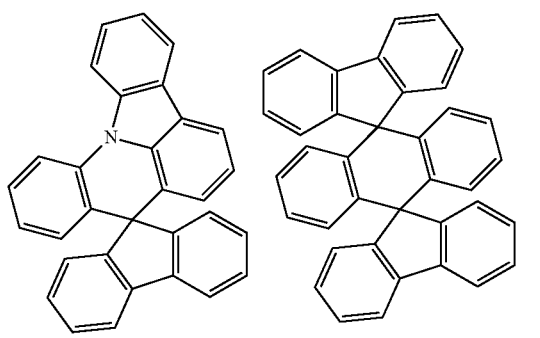

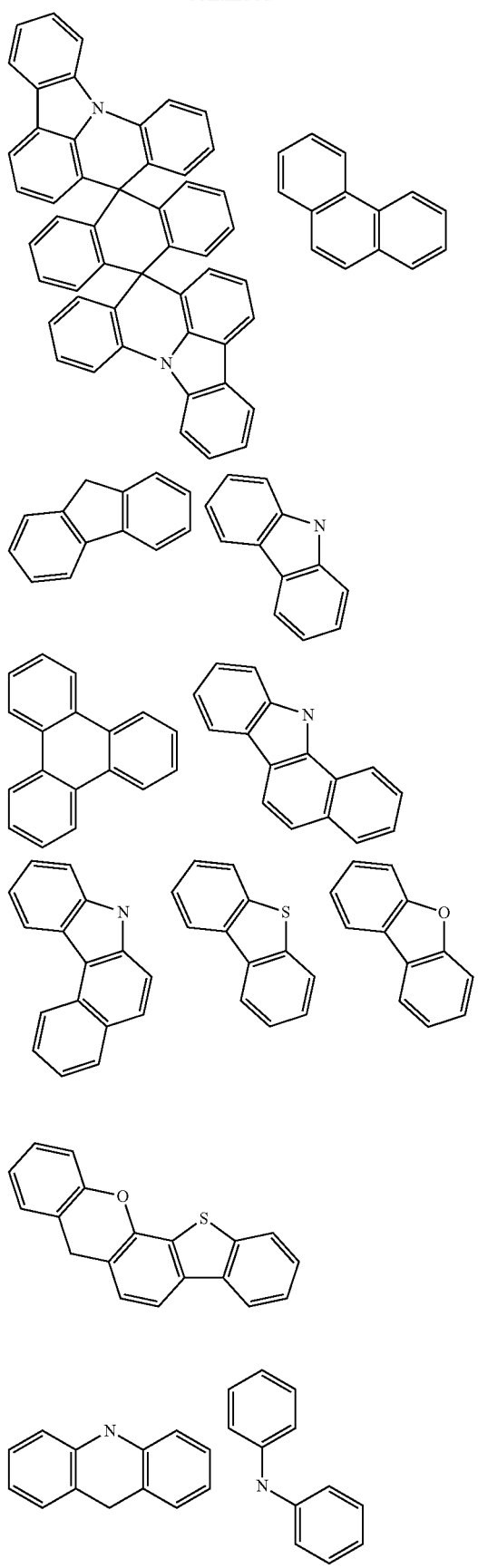

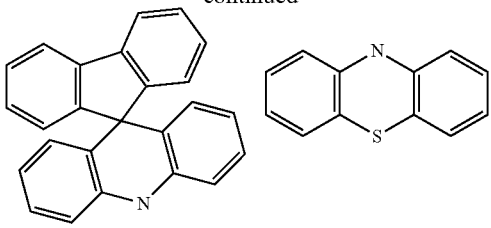

The structures may be unsubstituted or substituted with one, two or more substituents selected from the group consisting of deuterium; a substituted or unsubstituted alkyl group; a substituted or unsubstituted aryl group; and a substituted or unsubstituted heteroring group.

In the present specification, the meaning of the compound satisfying Equation 1 having a nitrogen-containing heteroring group or a p-type structure includes not only a case being included as a core structure in the compound structure but a case being included as a substituent.

In one embodiment of the present specification, the compound satisfying Equation 1 is represented by the following Chemical Formula 1.

Het-L-D1    [Chemical Formula 1]

In Chemical Formula 1,

Het is a substituted or unsubstituted nitrogen-containing heteroring group,

L is a direct bond; a substituted or unsubstituted arylene group; or a substituted or unsubstituted heteroring group, and D1 is a substituted or unsubstituted p-type structure.

The nitrogen-containing heteroring group and the p-type structure in Chemical Formula 1 may be same as those described above.

In the present specification, the nitrogen-containing heteroring functions as an n-type structure in the compound satisfying Equation 1, and may provide a bipolar-type structure by being linked to the p-type structure. Accordingly, the compound provided between a cathode and a light emitting layer according to one embodiment of the present specification is a bipolar-type and has excellent light emission efficiency since the compound is stable in both oxidized and reduced states.

In one embodiment of the present specification, L is a direct bond; a substituted or unsubstituted phenylene group; a substituted or unsubstituted biphenylene group; a substituted or unsubstituted terphenylene group; or a substituted or unsubstituted naphtylene group.

In one embodiment of the present specification, L is a direct bond.

In another embodiment, L is a substituted or unsubstituted phenylene group.

In another embodiment, L is a phenylene group.

In one embodiment of the present specification, L is a 1,3-phenylene group.

In another embodiment, L is a 1,4-phenylene group.

In one embodiment of the present specification, L is a phenylene group substituted with a heteroring group.

In one embodiment of the present specification, L is a phenylene group substituted with a nitrogen-containing heteroring group.

In one embodiment, L is a phenylene group substituted with a carbazole group.

In another embodiment, L is a substituted or unsubstituted biphenylene group.

In one embodiment of the present specification, L is a biphenylene group.

In one embodiment of the present specification, L is a substituted or unsubstituted terphenylene group.

In another embodiment, L is a terphenylene group.

In one embodiment of the present specification, L is a substituted or unsubstituted naphthylene group.

In one embodiment, L is a naphthylene group.

In one embodiment of the present specification, L is a 1,2-naphthylene group.

In another embodiment, Het is unsubstituted or substituted with one, two or more substituents selected from the group consisting of deuterium; a substituted or unsubstituted alkyl group; a substituted or unsubstituted aryl group; and a substituted or unsubstituted heteroring group.

In one embodiment of the present specification, Het is unsubstituted or substituted with one, two or more substituents selected from the group consisting of a cyano group; a substituted or unsubstituted methyl group; a substituted or unsubstituted phenyl group; a substituted or unsubstituted biphenyl group; a substituted or unsubstituted naphthyl group; a substituted or unsubstituted fluorenyl group; a substituted or unsubstituted carbozole group; a substituted or unsubstituted dibenzothiophene group; and a substituted or unsubstituted dibenzofuran group.

In one embodiment of the present specification, Het is unsubstituted or substituted with one, two or more substituents selected from the group consisting of a cyano group; a methyl group; a phenyl group; a phenyl group substituted with a carbazole group; a biphenyl group; a fluorenyl group substituted with a phenyl group; a naphthyl group substituted with a pyridine group substituted with a dibenzothiophene group; a naphthyl group substituted with a pyridine group substituted with a dibenzofuran group; a naphthyl group substituted with a pyrimidine group substituted with a dibenzothiophene group; a carbazole group; a dibenzothiophene group; and a dibenzofuran group.

In another embodiment, D1 is unsubstituted or substituted with one, two or more substituents selected from the group consisting of deuterium; a substituted or unsubstituted alkyl group; a substituted or unsubstituted aryl group; and a substituted or unsubstituted heteroring group.

In one embodiment of the present specification, D1 is unsubstituted or substituted with one, two or more substituents selected from the group consisting of deuterium; a substituted or unsubstituted methyl group; and a substituted or unsubstituted phenyl group.

In another embodiment, D1 is unsubstituted or substituted with one, two or more substituents selected from the group consisting of deuterium; a methyl group; a phenyl group; a phenyl group substituted with a triazine group substituted with an aryl group; a phenyl group substituted with a pyrimidine group substituted with an aryl group; and a phenyl group substituted with an imidazole group substituted with an alkyl group.

In one embodiment of the present specification, D1 is unsubstituted or substituted with one, two or more substituents selected from the group consisting of deuterium; a methyl group; a phenyl group; a phenyl group substituted with a triazine group substituted with a phenyl group; a phenyl group substituted with a pyrimidine group substituted with a phenyl group; and a phenyl group substituted with an imidazole group substituted with a methyl group.

In one embodiment of the present specification, the compound satisfying Equation 1 is represented by any one of the following Compounds 1 to 100.

Compound 1
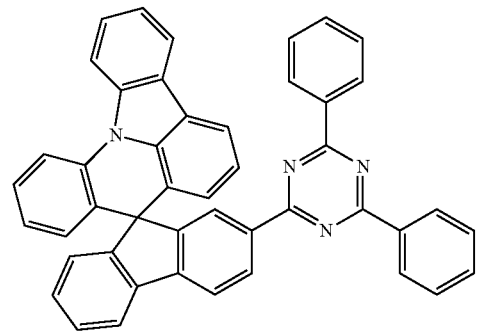
Compound 2
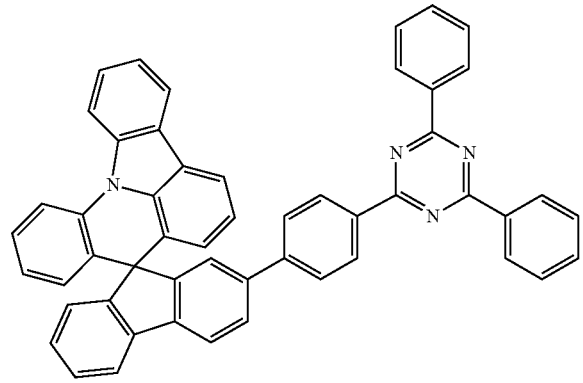
Compound 3
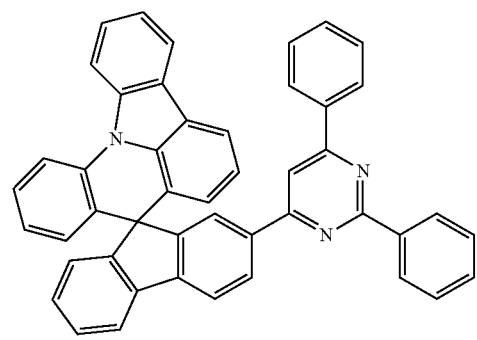
Compound 4
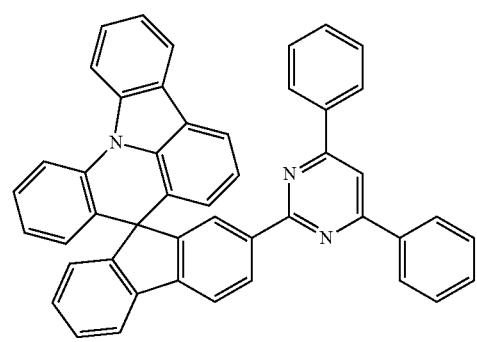
Compound 5
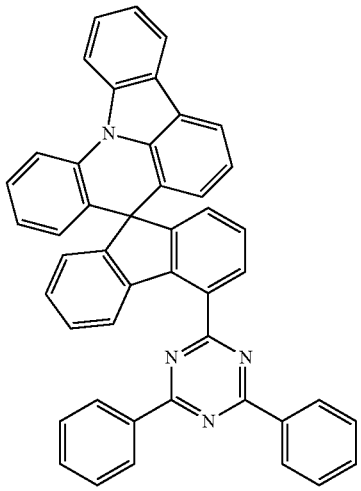
Compound 6
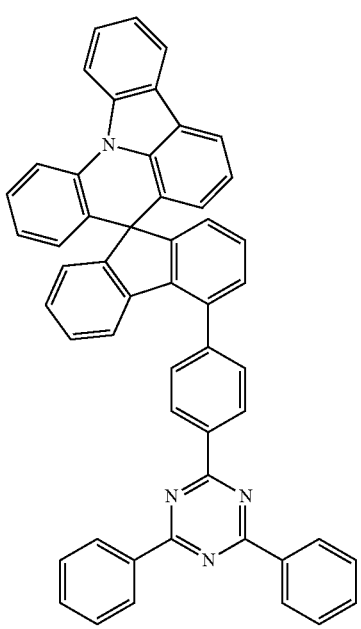
Compound 7
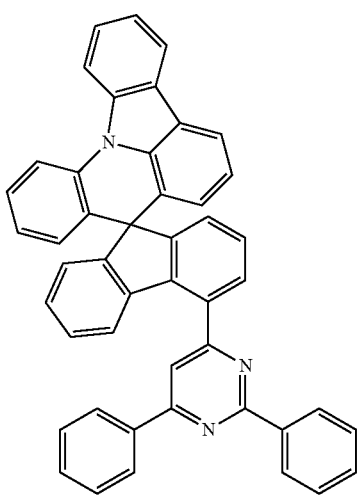

Compound 8
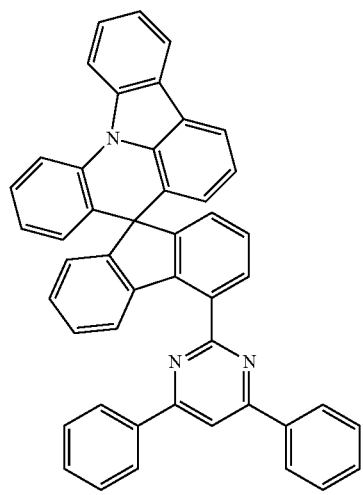
Compound 9
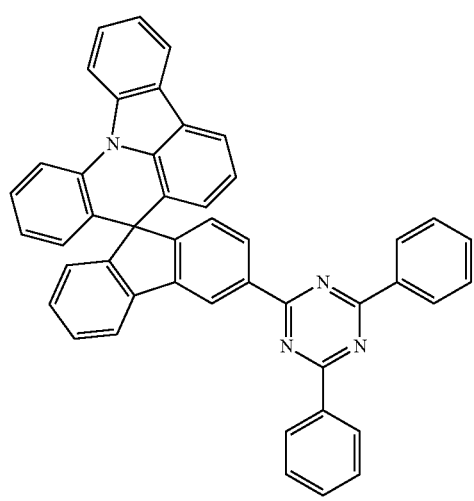
Compound 10
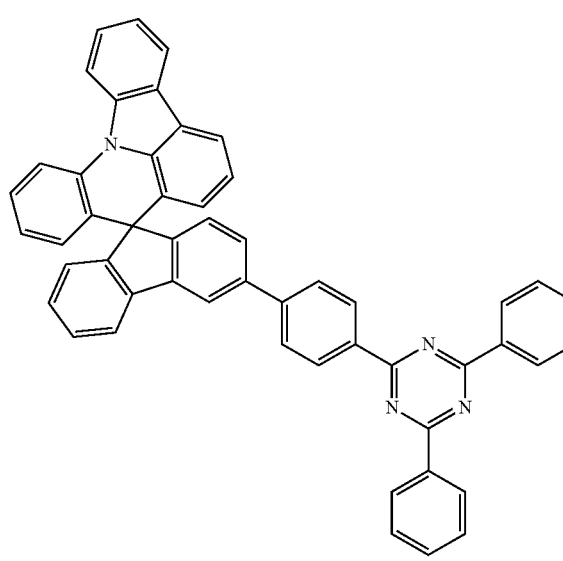
Compound 11
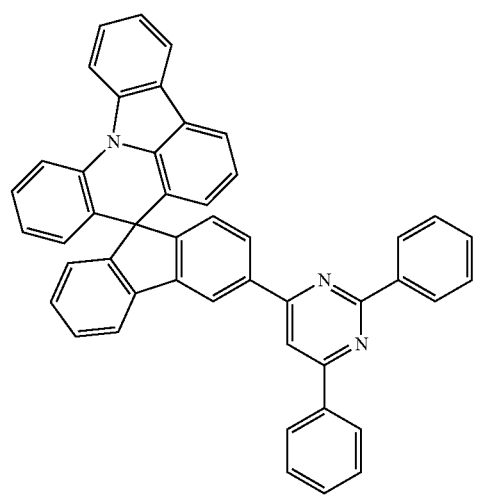
Compound 12
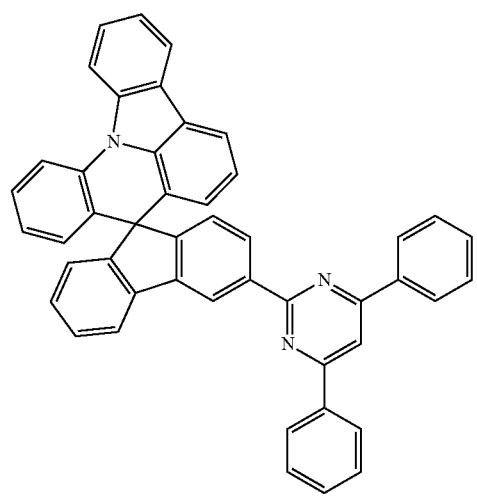
Compound 13

Compound 14
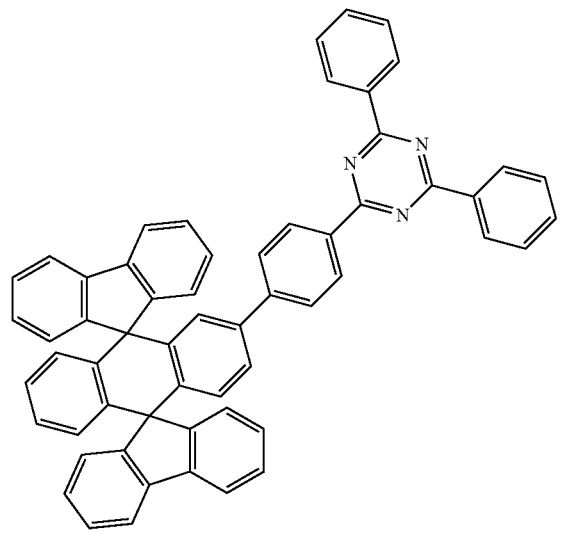
Compound 15
Compound 16
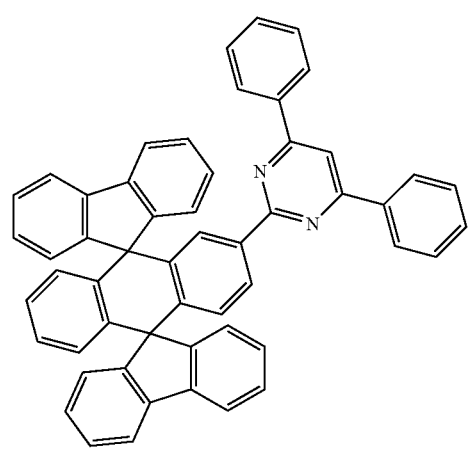
Compound 17
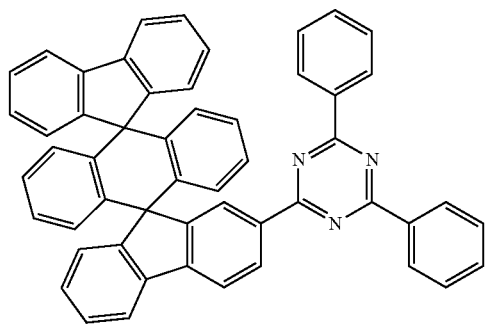
Compound 18
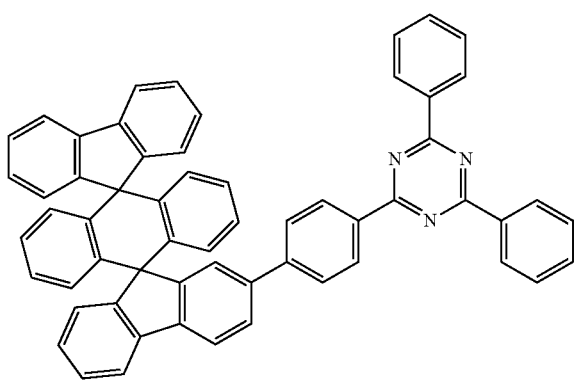
Compound 19
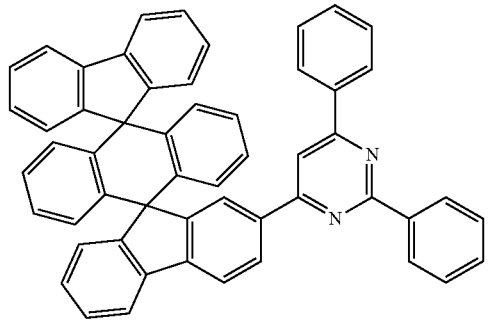
Compound 20

Compound 21
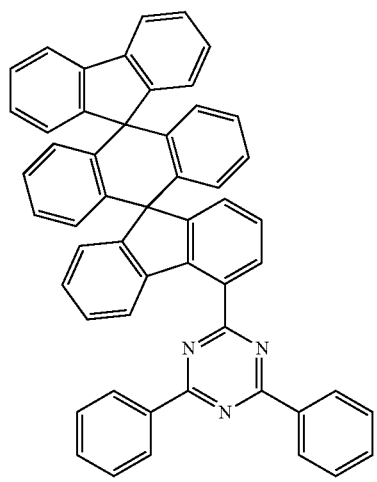
Compound 22
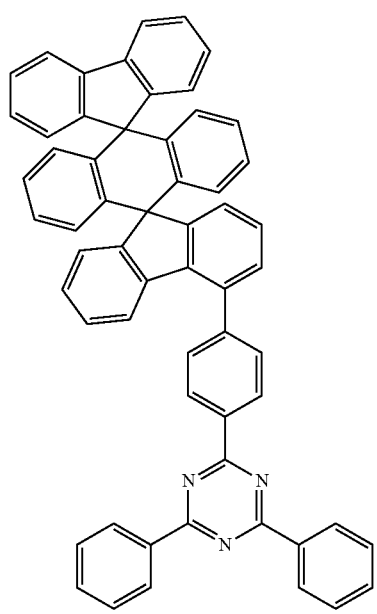
Compound 23
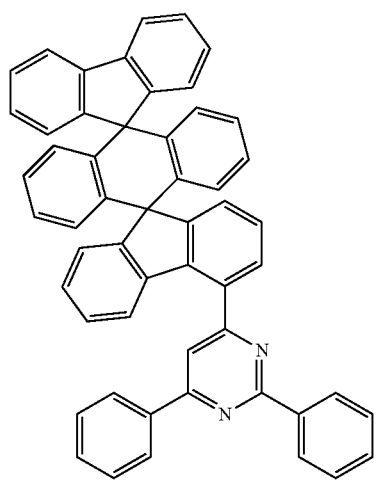
Compound 24
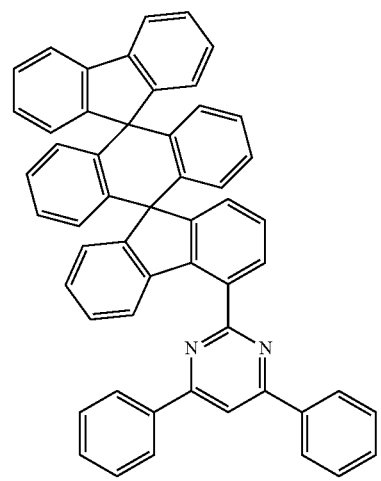
Compound 25
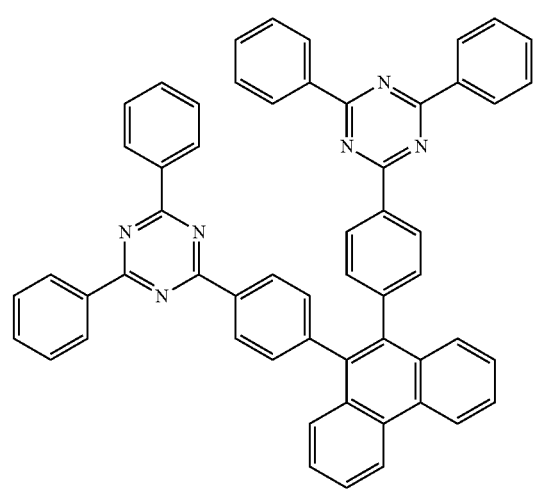
Compound 26
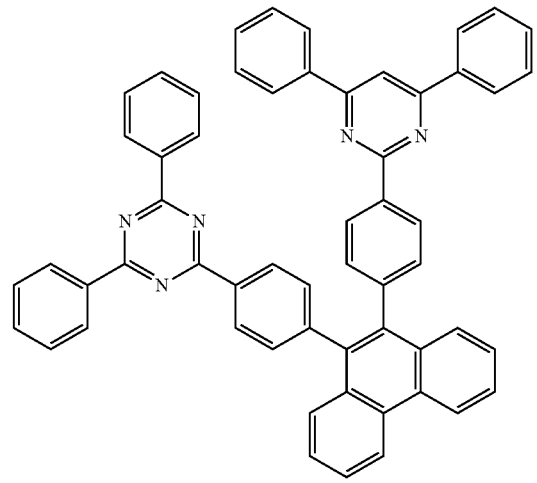

Compound 27
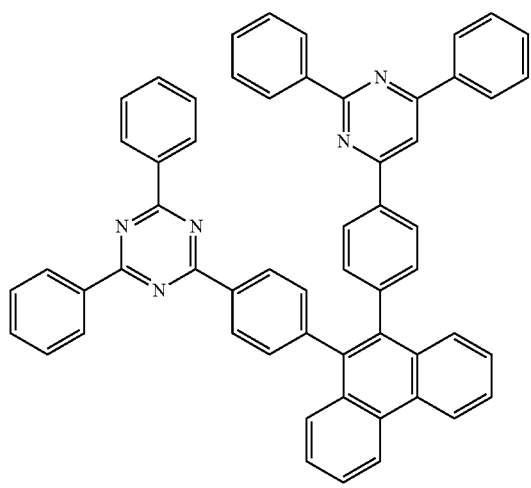
Compound 28
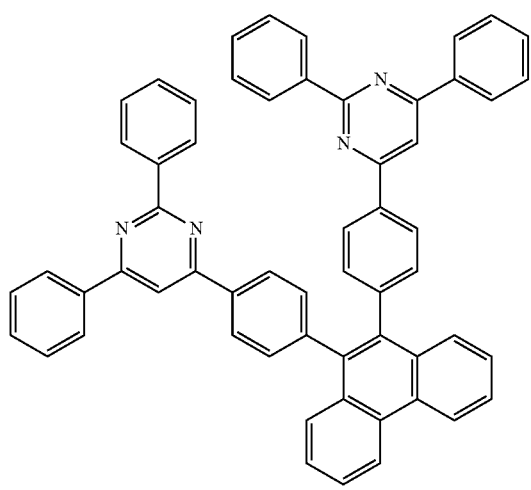
Compound 29
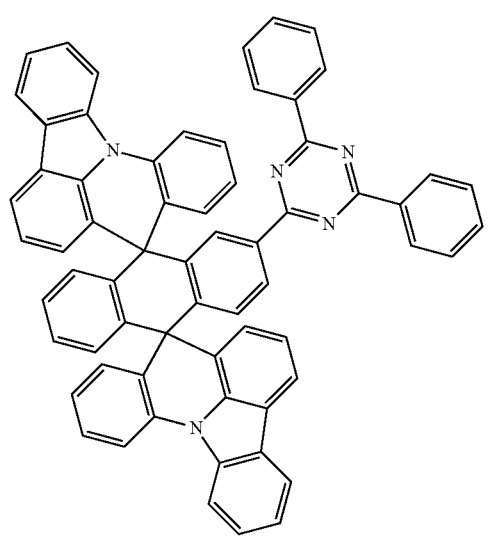
Compound 30
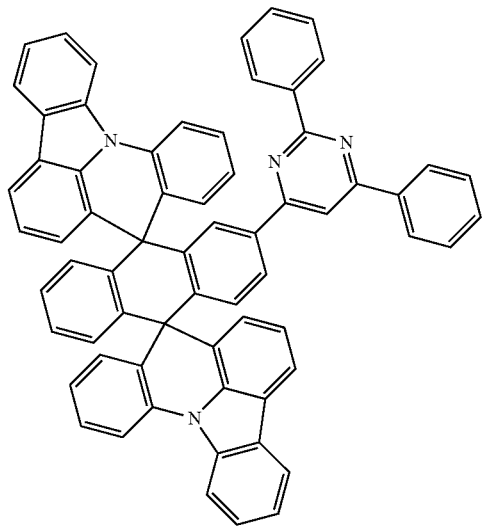
Compound 31
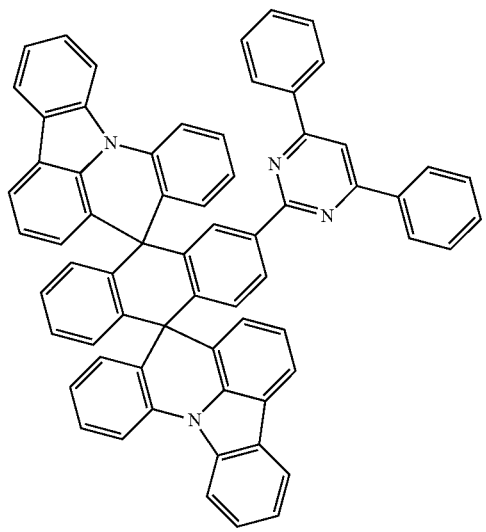
Compound 32
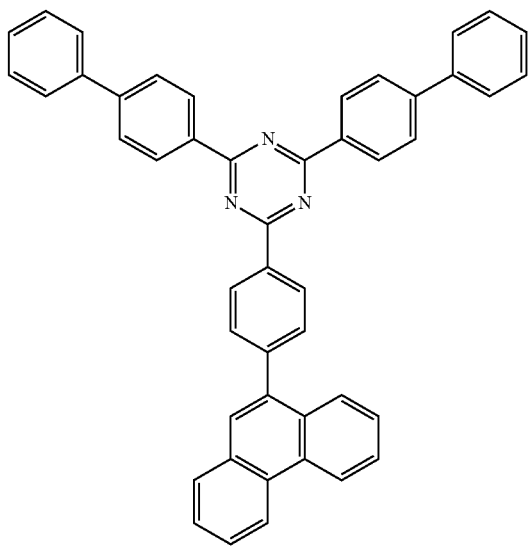

Compound 33
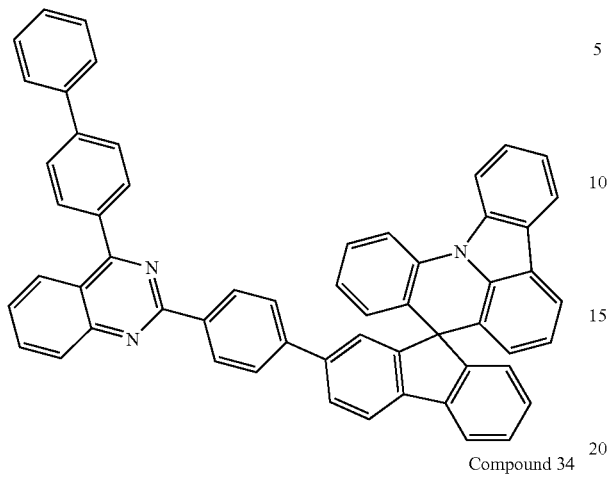
Compound 34
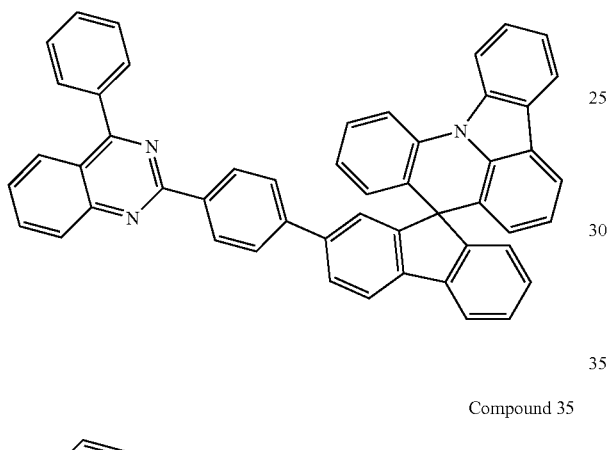
Compound 35
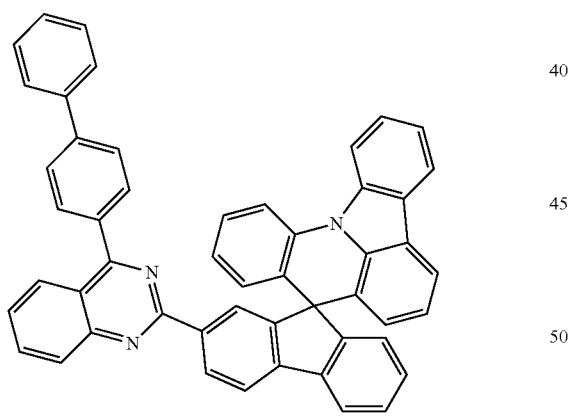
Compound 36
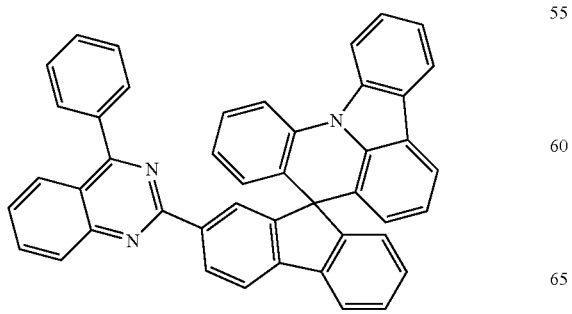
Compound 37
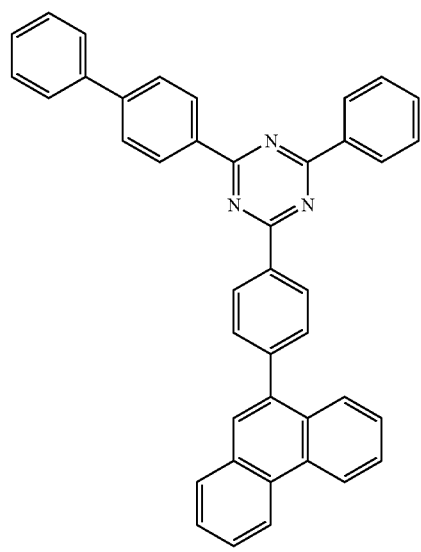
Compound 38
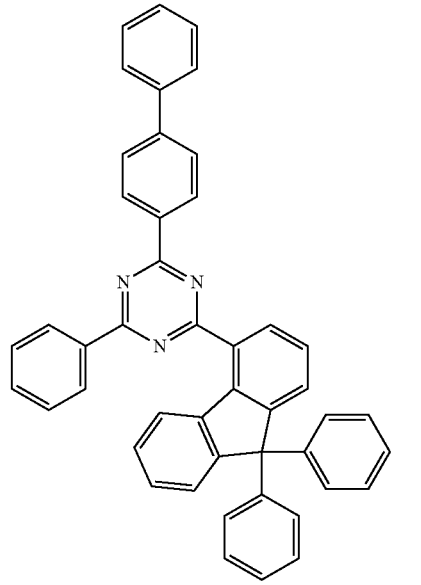
Compound 39
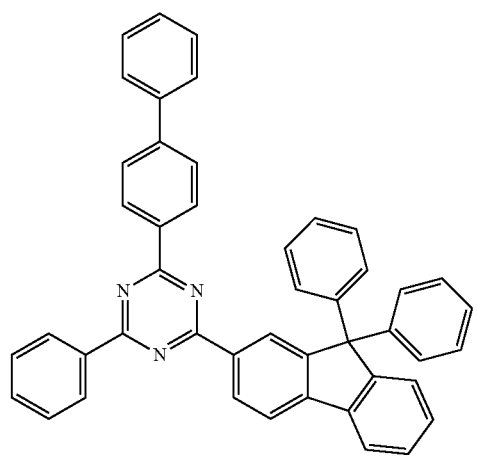

Compound 40
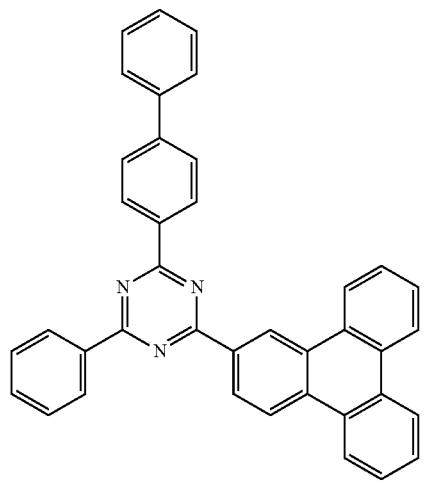
Compound 41
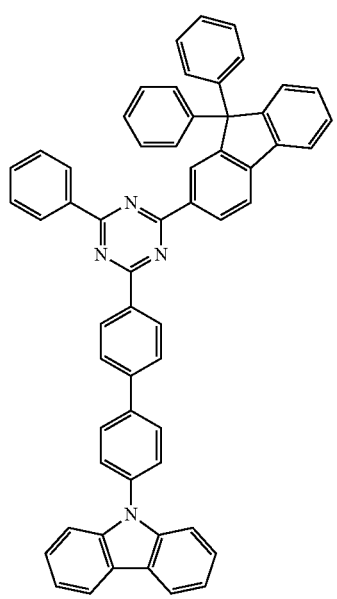
Compound 42
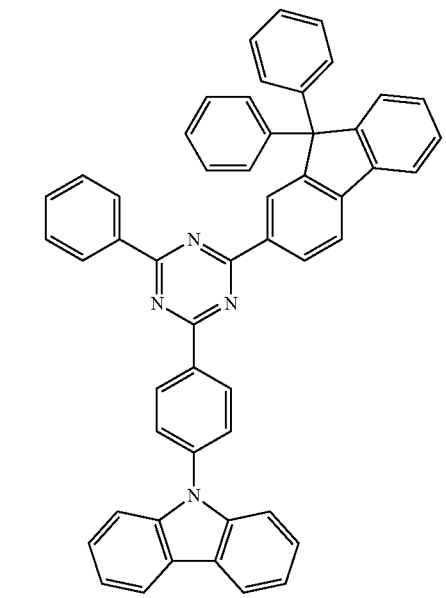
Compound 43
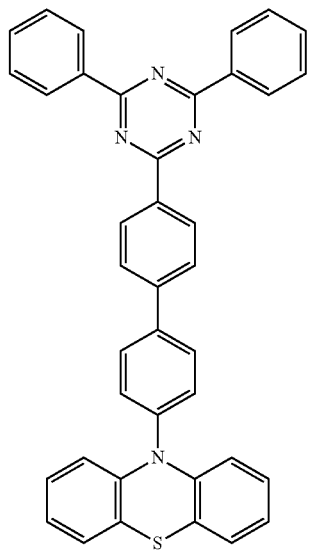
Compound 44
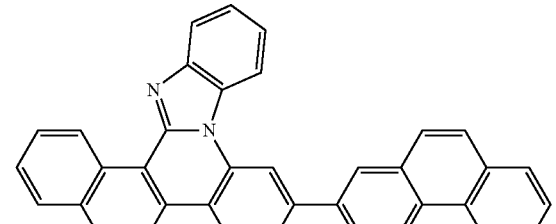

-continued
Compound 45
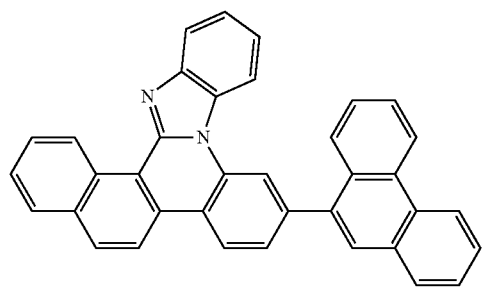
Compound 46
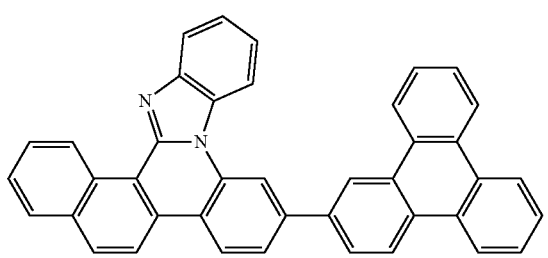
Compound 47
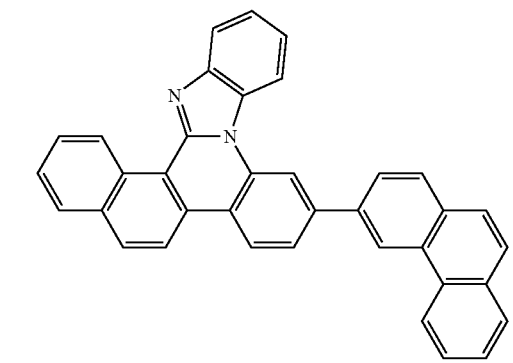
Compound 48
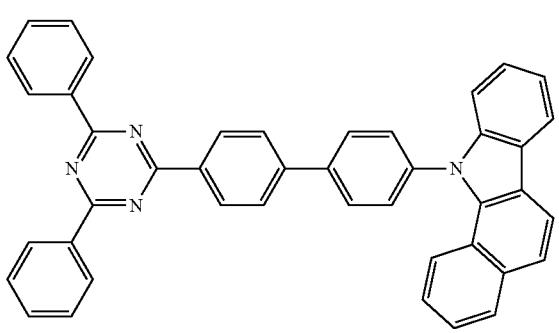
-continued
Compound 49
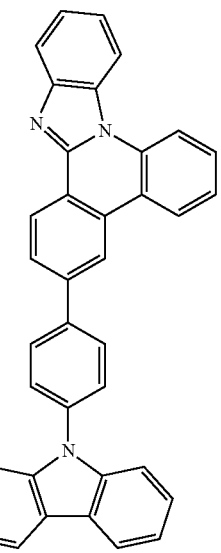
Compound 50
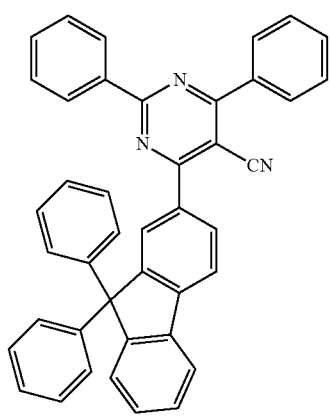
Compound 51
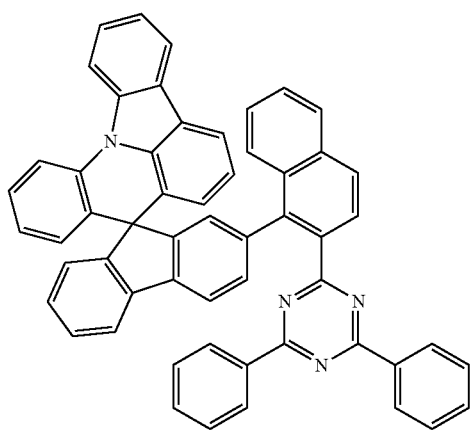

Compound 52
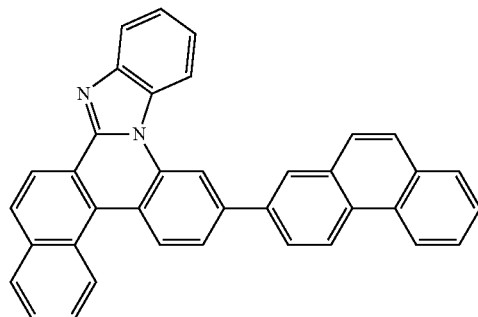
Compound 53
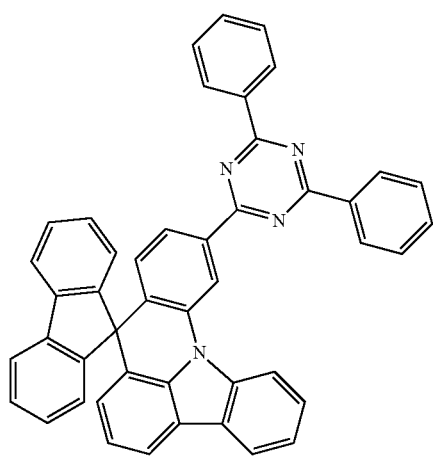
Compound 54
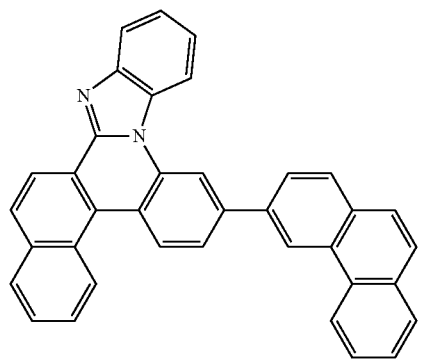
Compound 55
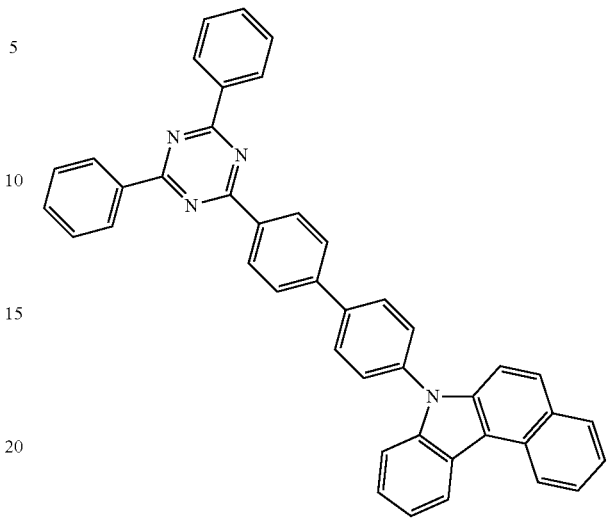
Compound 56
Compound 57
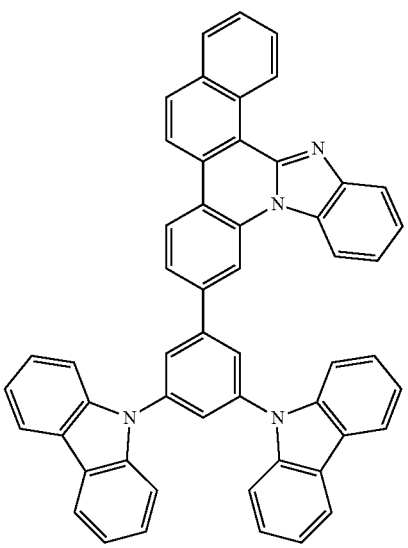

Compound 58
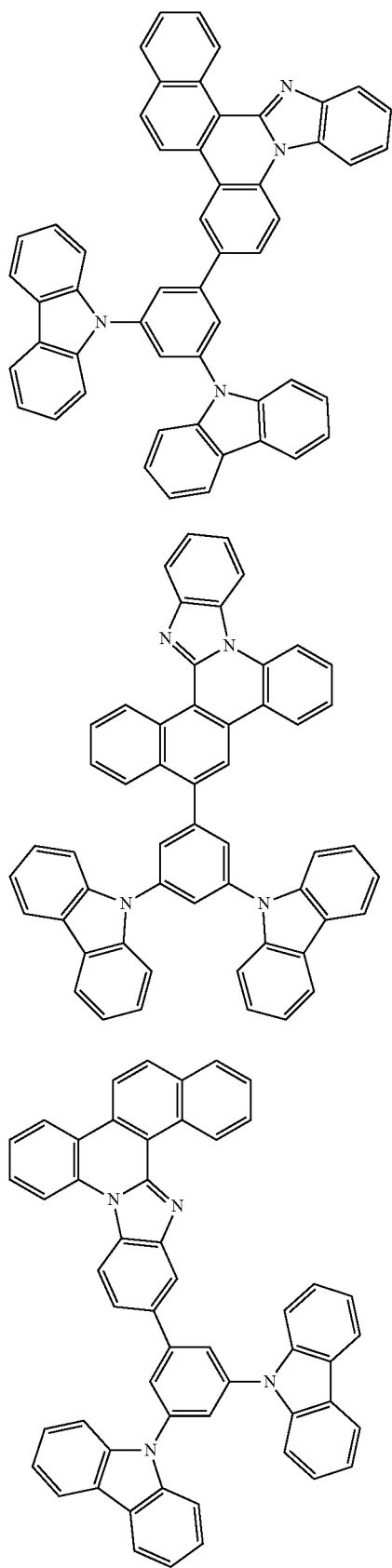
Compound 59
Compound 60
Compound 61
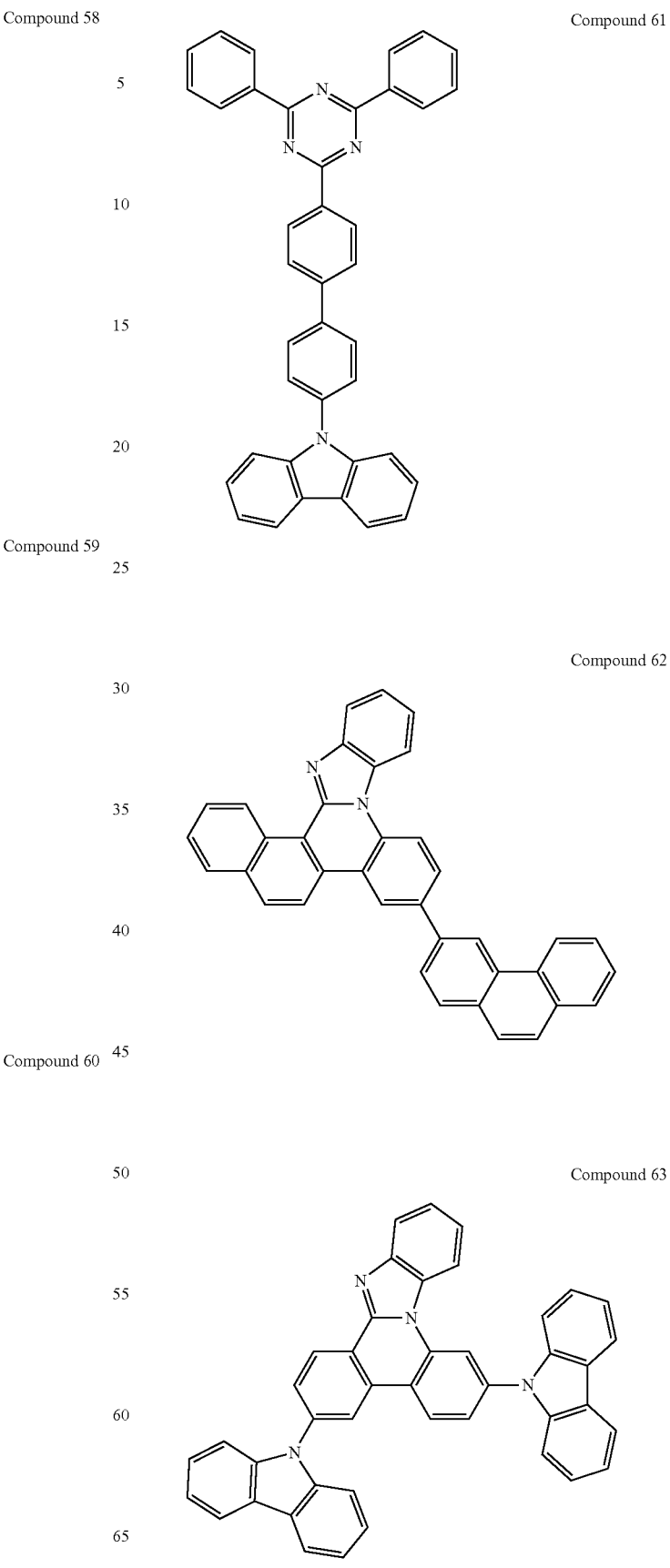
Compound 62
Compound 63

Compound 64
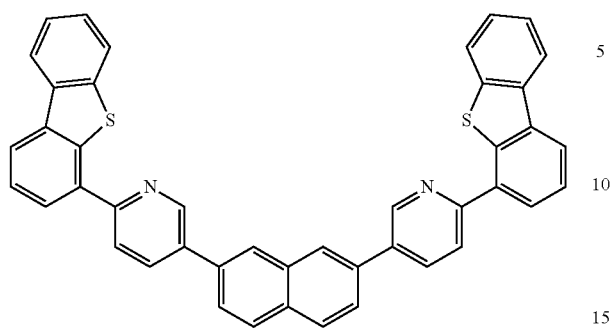
Compound 65
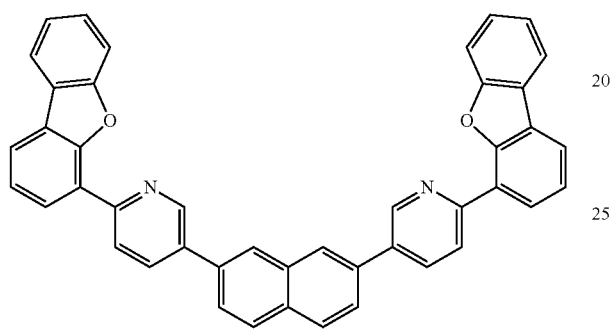
Compound 66
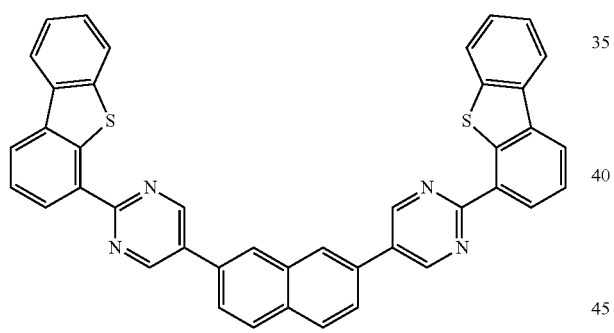
Compound 67
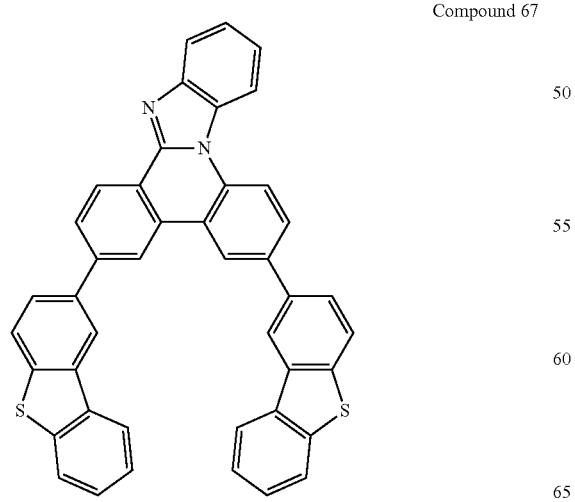
Compound 68
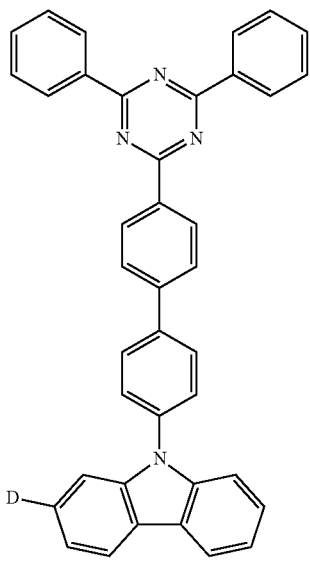
Compound 69
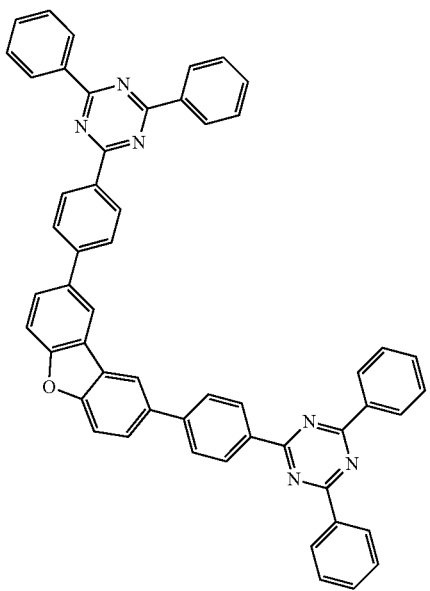

Compound 70
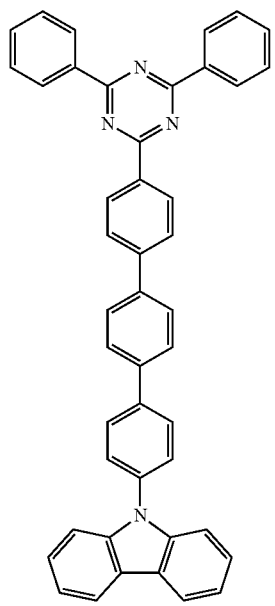
Compound 71
Compound 72
Compound 73
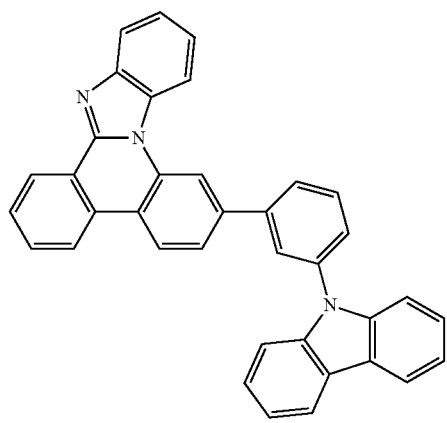
Compound 74
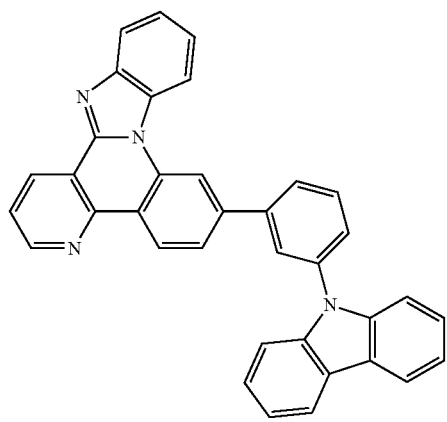
Compound 75
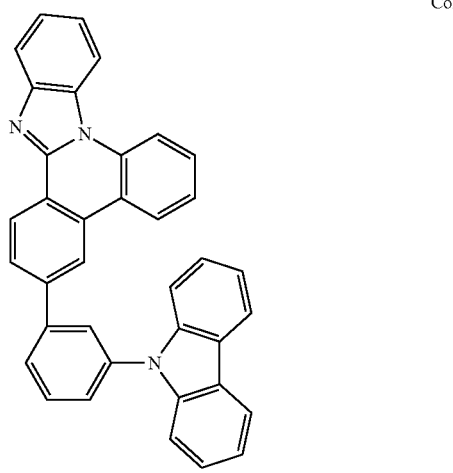

Compound 76
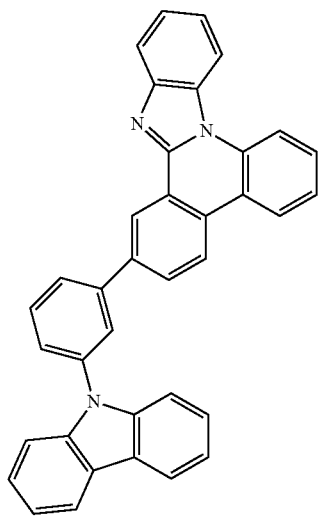
Compound 77
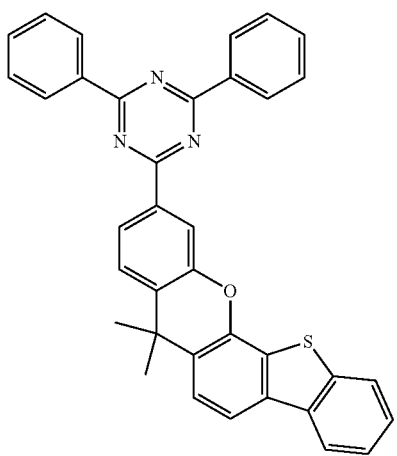
Compound 78
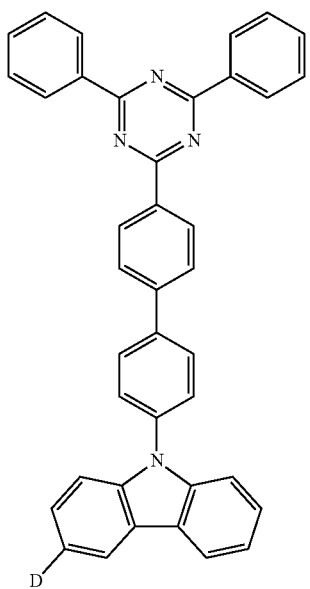
Compound 79
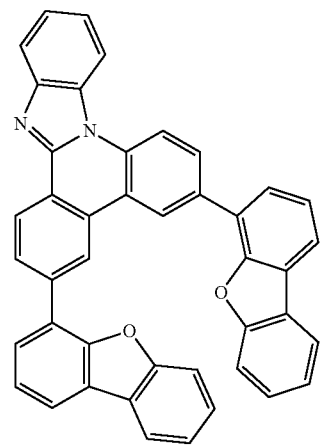
Compound 80
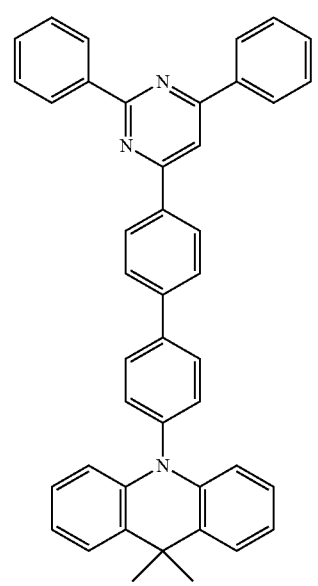
Compound 81
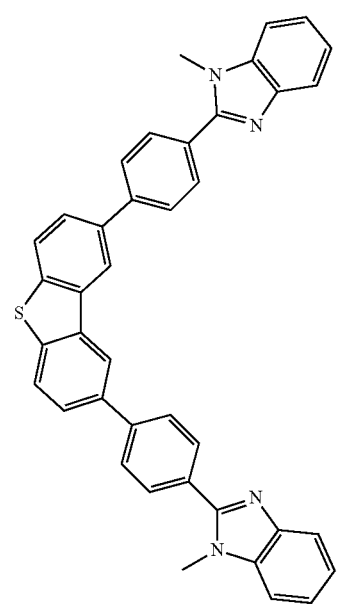

Compound 82
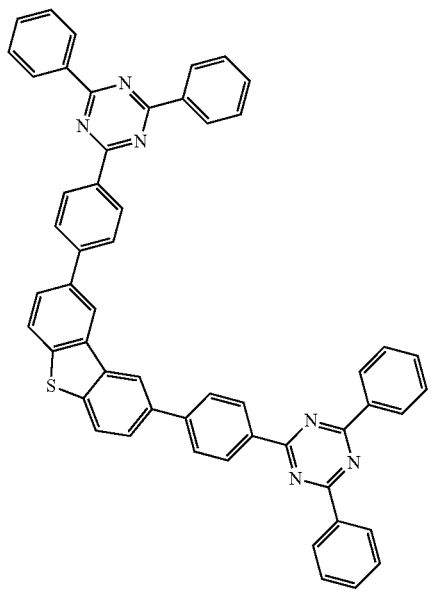
Compound 83
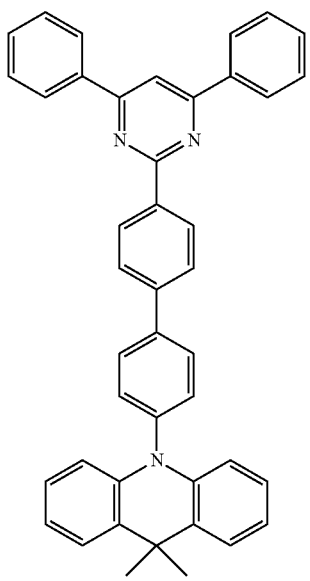
Compound 84
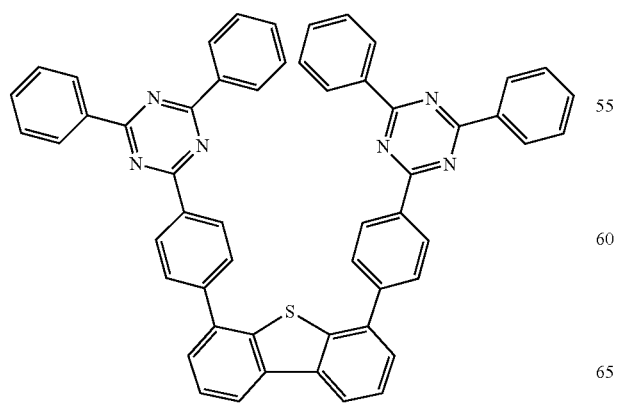
Compound 85
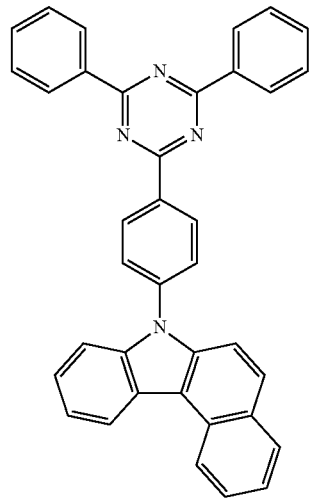
Compound 86
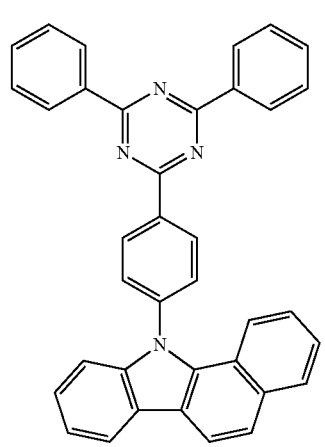
Compound 87
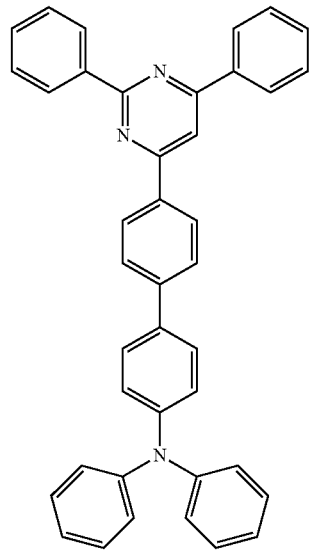

Compound 88
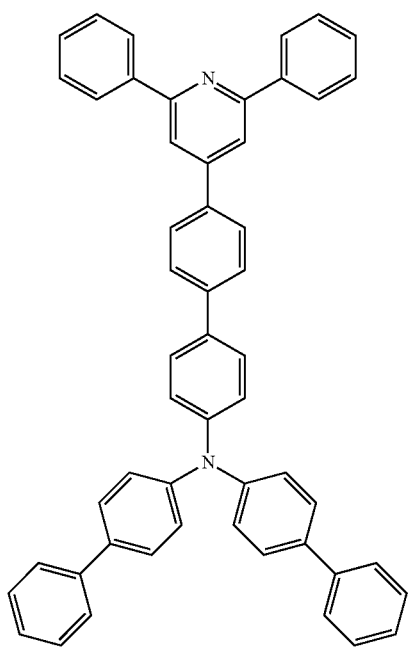
Compound 89
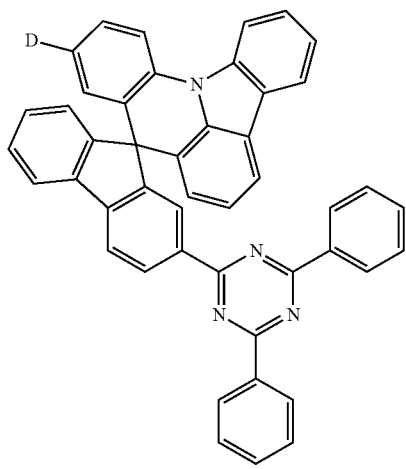
Compound 90
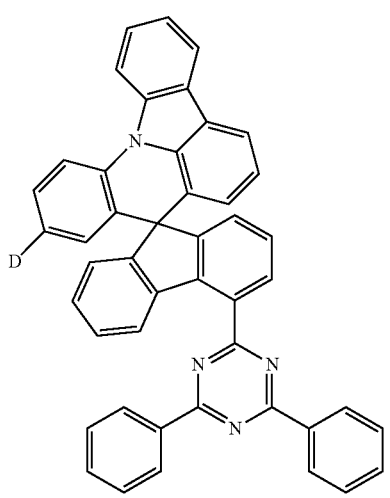
Compound 91
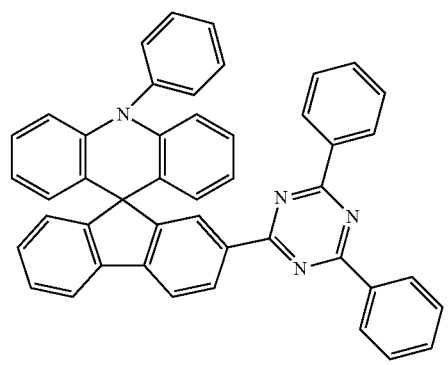
Compound 92
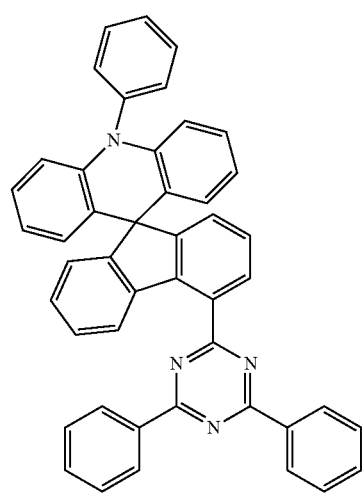
Compound 93
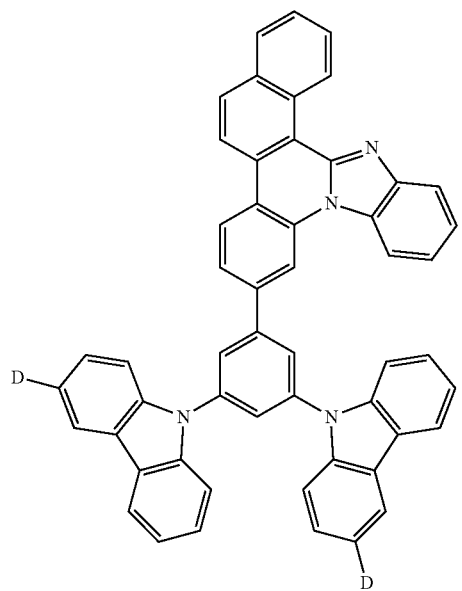

Compound 94
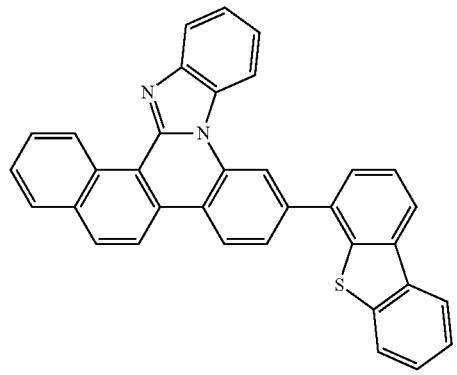
Compound 95
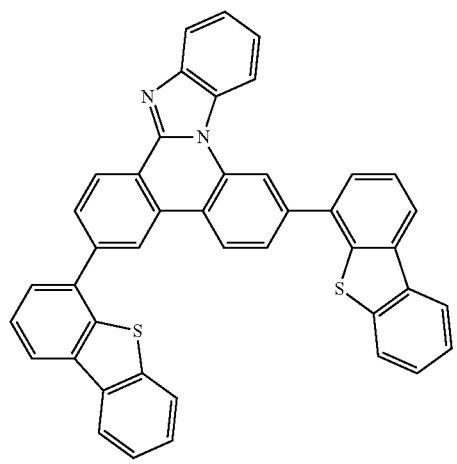
Compound 96
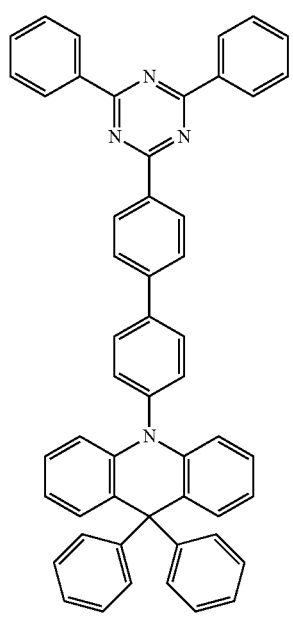
Compound 97
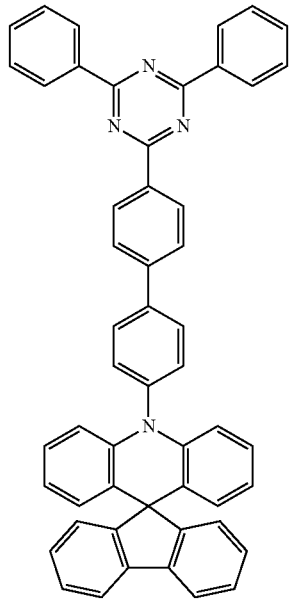
Compound 98
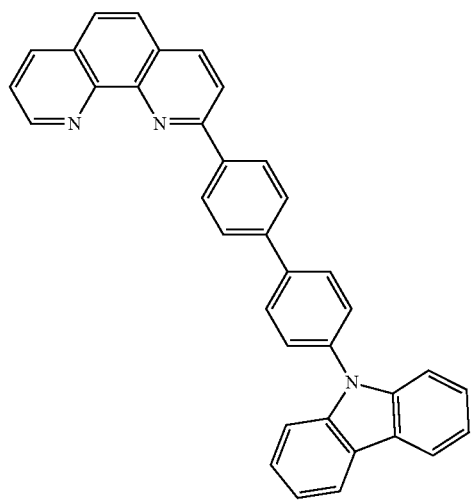

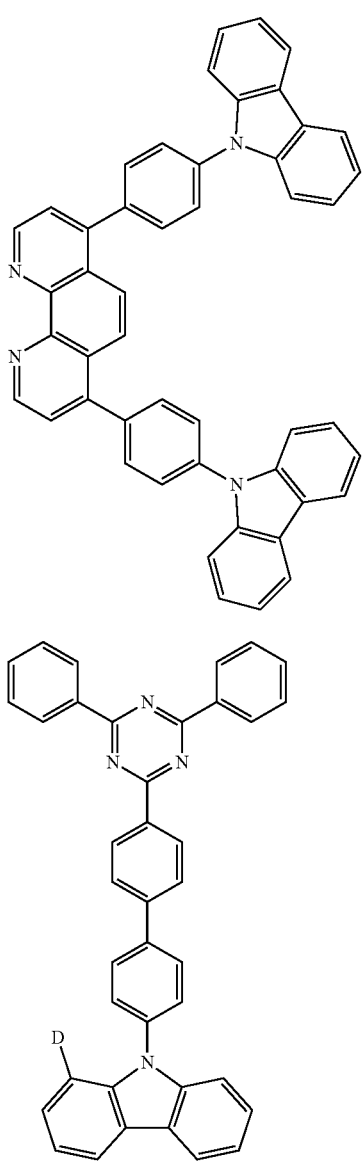

Compound 99

Compound 100

An organic light emitting diode of the present specification may be manufactured using materials and methods known in the art except that the organic light emitting diode includes an organic material layer including the compound satisfying Equation 1 described above.

For example, an organic light emitting diode of the present specification may be manufactured by consecutively laminating an anode, an organic material layer and a cathode on a substrate. Herein, the organic light emitting diode of the present specification may be manufactured by forming an anode through depositing a metal or a metal oxide having conductivity or an alloy thereof on a substrate using a physical vapor deposition (PVD) method such as a sputtering method or an e-beam evaporation method, forming an organic material layer including a hole injection layer, a hole transfer layer, an electron blocking layer, a light emitting layer, an electron transfer layer and an electron injection layer thereon, and then depositing a material capable of being used as a cathode thereon. Besides the method such as above, the organic light emitting diode may be manufactured by consecutively depositing a cathode material, an organic material layer and an anode material on a substrate. Besides the method such as above, the organic light emitting diode e may be manufactured by consecutively depositing an anode material, an organic material layer and a cathode material on a substrate.

The organic material layer of the organic light emitting diode of the present specification may be formed in a multilayer structure in which one or more organic material layers are laminated.

In one embodiment of the present specification, the organic light emitting diode may further include one, two or more layers selected from the group consisting of a hole injection layer, a hole transfer layer, an electron transfer layer, an electron injection layer, an electron blocking layer and a hole blocking layer.

For example, the structure of the organic light emitting diode of the present specification may include a structure as shown in FIG. 1, however, the structure is not limited thereto.

FIG. 1 illustrates a structure of an organic light emitting diode in which an anode (201), a hole transfer layer (301), a light emitting layer (401), an electron transfer layer (501) and a cathode (601) are consecutively laminated on a substrate (101). In FIG. 1, the electron transfer layer (501) includes the compound satisfying Equation 1.

FIG. 1 shows an illustrative structure according to an embodiment of the present specification, and may further include other organic material layers.

When the organic light emitting diode includes a plurality of organic material layers, the organic material layers may be formed with the same material or with different materials.

As the anode material, a material having large work function is normally preferable so that hole injection to the organic material layer is smooth. Specific examples of the anode material capable of being used in the present invention include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or SnO$_2$:Sb; conductive polymers such as poly(3-methylthiophene), poly[3,4-(ethylen-1,2-dioxy)thiophene] (PEDOT), polypyrrole and polyaniline, and the like, but are not limited thereto.

As the cathode material, a material having small work function is normally preferable so that electron injection to the organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al or LiO$_2$/Al, and the like, but are not limited thereto.

The hole injection layer is a layer that injects holes from an electrode, and the hole injection material is preferably a compound that has an ability to transfer holes, therefore, has a hole injection effect in an anode, has an excellent hole injection effect for a light emitting layer or a light emitting material, prevents excitons generated in the light emitting layer from moving to an electron injection layer or an electron injection material, and in addition, has an excellent thin film forming ability. The highest occupied molecular orbital (HOMO) of the hole injection material is preferably in between the work function of an anode material and the HOMO of surrounding organic material layers. Specific examples of the hole injection material include a metal porphyrin, oligothiophene, an arylamin-based organic material, a hexanitrilehexazatriphenylen-based organic material, a quinacridon-based organic material, a perylen-based organic material, anthraquinone, and a polyanilin- and a polythiophen-based conductive polymer, and the like, but are not limited thereto.

The hole transfer layer is a layer that receives holes from a hole injection layer and transfers the holes to a light emitting layer, and as the hole transfer material, a material capable of receiving the holes from an anode or a hole injection layer, moving the holes to a light emitting layer, and having high mobility for the holes, is suitable. Specific examples thereof include an arylamine-based organic material, a conductive polymer, a block copolymer having conjugated parts and non-conjugated parts together, and the like, but are not limited thereto.

The light emitting material is a material capable of emitting light in a visible light region by receiving holes and electrons from a hole transfer layer and an electron transfer layer, respectively, and binding the holes and the electrons, and is preferably a material having favorable quantum efficiency for fluorescence or phosphorescence. Specific examples thereof include a 8-hydroxy-quinoline aluminum complex ($Alq_3$); a carbazole-based compound; a dimerized styryl compound; BAlq; a 10-hydroxybenzo quinolin-metal compound; a benzoxazole-, a benzthiazole- and a benzimidazole-based compound; a poly(p-phenylenevinylene) (PPV)-based polymer; a spiro compound; polyfluorene, rubrene, and the like, but are not limited thereto.

The light emitting layer may include a host material and a dopant material. The host material includes a fused aromatic ring derivative, a heteroring-containing compound or the like. Specifically, the fused aromatic ring derivative includes an anthracene derivative, a pyrene derivative, a naphthalene derivative, a pentacene derivative, a phenanthrene compound, a fluoranthene compound and the like, and the heteroring-containing compound includes a carbazole derivative, a dibenzofuran derivative, a ladder-type furan compound, a pyrimidine derivative and the like, but the material is not limited thereto.

In the fluorescent light emitting layer, one, two or more are selected from the group consisting of distyrylarylene (DSA), a distyrylarylene derivative, distyrylbenzene (DSB), a distyrylbenzene derivative, 4,4'-bis(2,2f-diphenylvinyl)-1, 1'-biphenyl (DPVBi), a DPVBi derivative, spiro-DPVBi and spiro-sexyphenyl (spiro-6P) as a host material.

In the fluorescent light emitting layer, one, two or more are selected from the group consisting of styrylamine-based, perylene-based and distyrylbiphenyl (DSBP)-based as a dopant material.

The electron injection layer is a layer that injects electrons from an electrode, and the electron injection material is preferably a compound that has an ability to transfer electrons, has an electron injection effect from a cathode and has an excellent electron injection effect for a light emitting layer or a light emitting material, prevents excitons generated in the light emitting layer from moving to a hole injection layer, and in addition, has an excellent thin film forming ability. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, a metal complex compound, a nitrogen-containing 5-membered ring derivative, and the like, but are not limited thereto.

The metal complex compound may include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)berylium, bis(10-hydroxybenzo[h]quinolinato)zinc, bis(2-methyl-8-quinolinato)chlorogallium, bis(2-methyl-8-quinolinato) (o-cresolato)gallium, bis(2-methyl-8-quinolinato) (1-naphtholato)aluminum, bis(2-methyl-8-quinolinato) (2-naphtholato)gallium, and the like, but is not limited thereto.

The hole blocking layer is a layer that blocks holes from reaching a cathode, and may generally be formed under the same condition as the hole injection layer. Specific examples thereof include an oxadiazole derivative or a triazole derivative, a phenanthroline derivative, BCP, an aluminum complex and the like, but are not limited thereto.

The organic light emitting diode according to the present specification may be a top-emission type, a bottom-emission type or a dual-emission type depending on the materials used.

In addition, the organic light emitting diode according to the present specification may be a normal-type in which a lower electrode is an anode and an upper electrode is a cathode, or is an inverted-type in which a lower electrode is a cathode and an upper electrode is an anode.

The structure according to one embodiment of the present specification may also be used in organic electronic devices including organic solar cells, organic photo conductors, organic transistors and the like using a principle similar to that used in the organic light emitting diode.

Hereinafter, the present specification will be described in detail with reference to examples. However, the examples according to the present specification may be modified to various other forms, and the scope of the present specification is not interpreted to be limited to the examples described below. The examples of the present specification are provided in order to more completely describe the present specification for those skilled in the art.

Experimental Example 1.

The values of Equation 1 for the compounds represented by Compounds 1 to 100 are shown in the following Table 1.

In Equation 1, optimization of a molecular structure and calculation of each energy were carried out by a density functional theory (DFT) using BPW91 function and dnd basis function with Dmol3, a quantum chemistry calculation program of BIOVIA (former Accelrys).

TABLE 1

| Compound 1 | Compound 2 | Compound 3 | Compound 4 |
|---|---|---|---|
| 0.14 | 0.16 | 0.2 | 0.07 |
| Compound 6 | Compound 13 | Compound 25 | Compound 32 |
| 0.14 | 0.1 | 0.02 | 0.04 |
| Compound 33 | Compound 34 | Compound 35 | Compound 37 |
| 0.13 | 0.08 | 0.14 | 0.08 |
| Compound 38 | Compound 39 | Compound 40 | Compound 41 |
| 0.11 | 0.07 | 0.1 | 0.12 |
| Compound 42 | Compound 44 | Compound 45 | Compound 46 |
| 0.15 | 0.1 | 0.09 | 0.1 |
| Compound 47 | Compound 48 | Compound 49 | Compound 50 |
| 0.1 | 0.14 | 0.12 | 0.11 |
| Compound 51 | Compound 52 | Compound 53 | Compound 54 |
| 0.16 | 0.08 | 0.1 | 0.09 |
| Compound 55 | Compound 56 | Compound 57 | Compound 61 |
| 0.12 | 0.13 | 0.23 | 0.17 |
| Compound 62 | Compound 63 | Compound 64 | Compound 65 |
| 0.07 | 0.12 | 0.1 | 0.06 |
| Compound 66 | Compound 67 | Compound 68 | Compound 69 |
| 0.1 | 0.1 | 0.17 | 0.04 |
| Compound 70 | Compound 71 | Compound 72 | Compound 73 |
| 0.2 | 0.13 | 0.09 | 0.21 |
| Compound 74 | Compound 75 | Compound 76 | Compound 77 |
| 0.26 | 0.18 | 0.18 | 0.07 |

TABLE 1-continued

| Compound 78 | Compound 79 | Compound 81 | Compound 86 |
|---|---|---|---|
| 0.17 | 0.09 | 0.1 | 0.05 |
| Compound 87 | Compound 88 | Compound 89 | Compound 90 |
| 0.22 | 0.18 | 0.14 | 0.09 |
| Compound 91 | Compound 92 | Compound 93 | Compound 94 |
| 0.11 | 0.09 | 0.23 | 0.1 |
| Compound 95 | Compound 100 | | |
| 0.12 | 0.17 | | |

EXAMPLE

Example 1 Manufacture of Organic Light Emitting Diode

A glass substrate (corning 7059 glass) on which indium tin oxide (ITO) was coated as a thin film to a thickness of 1,000 Å was placed in detergent-dissolved distilled water and ultrasonic cleaned. Herein, a product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonic cleaned with solvents such as isopropyl alcohol, acetone and methanol, and dried, and then transferred to a plasma cleaner. In addition, the substrate was dry-cleaned for 5 minutes using oxygen plasma, and then transferred to a vacuum depositor.

On the transparent ITO electrode prepared as above, hexanitrilehexaazatriphenylene (hereinafter, referred to as HAT), a compound of the following chemical formula, was thermal vacuum deposited to a thickness of 500 Å to form a thin film. This thin film is capable of enhancing an interfacial property between the substrate and a hole injection layer.

Subsequently, a hole transfer layer was formed by depositing a compound of the following Chemical Formula HT-1 to a thickness of 400 Å on the thin film, and an electron blocking layer was formed by depositing a compound of the following EB-1 thereon to a thickness of 250 Å. A compound of the following H1 and a compound of the following D1 were vacuum deposited to a thickness of 200 Å thereon as a host and a dopant, respectively, of a light emitting layer. An electron injection and transfer layer was formed on the light emitting layer to a thickness of 300 Å by vacuum depositing an electron transfer layer material of Compound 2 and lithium quinolate (LiQ) in a weight ratio of 1:1. A cathode was formed on the electron transfer layer by depositing lithium fluoride (LiF) to a thickness of 12 Å and aluminum to a thickness of 2,000 Å in consecutive order.

In the above-mentioned process, the deposition rates of the organic materials were maintained at 0.3 to 0.8 Å/sec. In addition, the deposition rates of the lithium fluoride and the aluminum of the cathode were maintained at 0.3 Å/sec and 1.5 to 2.5 Å/sec, respectively. The degree of vacuum when being deposited was maintained at 1 to $3 \times 10^{-7}$.

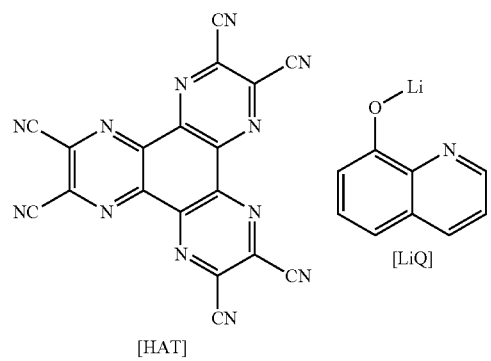

[HAT]   [LiQ]

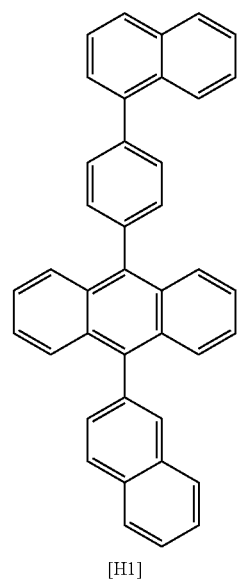

[H1]

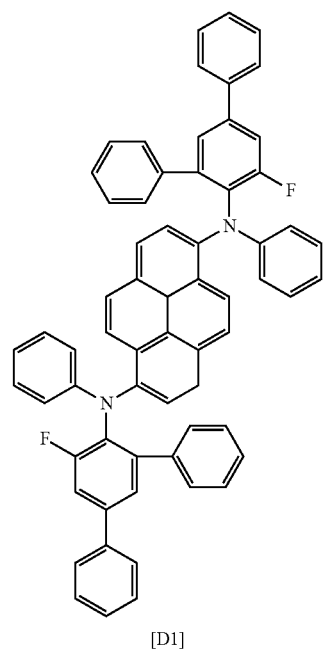

[D1]

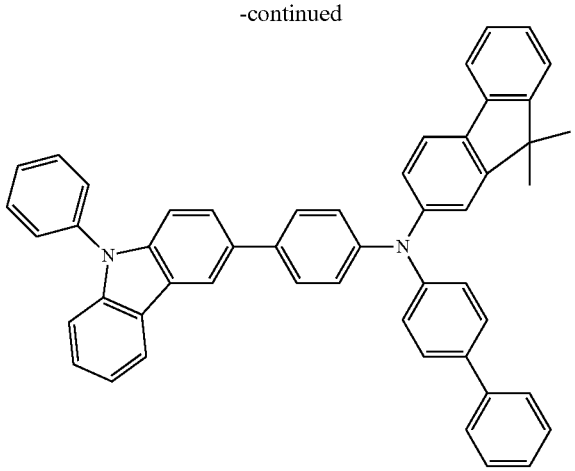

[HT-1]

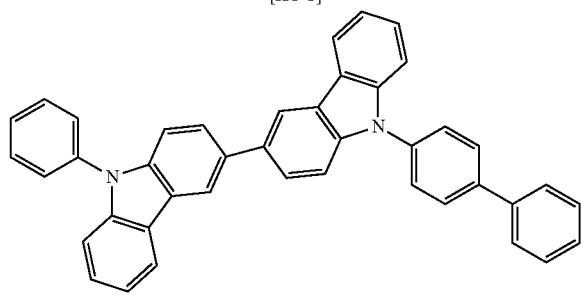

[EB-1]

Example 2

An organic light emitting diode was manufactured in the same manner as in Example 1 except that Compound 13 was used instead of Compound 2.

Example 3 Manufacture of Organic Light Emitting Diode

An organic light emitting diode was manufactured in the same manner as in Example 1 except that Compound 25 was used instead of Compound 2.

Example 4 Manufacture of Organic Light Emitting Diode

An organic light emitting diode was manufactured in the same manner as in Example 1 except that Compound 35 was used instead of Compound 2.

Example 5 Manufacture of Organic Light Emitting Diode

An organic light emitting diode was manufactured in the same manner as in Example 1 except that Compound 37 was used instead of Compound 2.

Example 6 Manufacture of Organic Light Emitting Diode

An organic light emitting diode was manufactured in the same manner as in Example 1 except that Compound 38 was used instead of Compound 2.

Example 7 Manufacture of Organic Light Emitting Diode

An organic light emitting diode was manufactured in the same manner as in Example 1 except that Compound 39 was used instead of Compound 2.

Example 8 Manufacture of Organic Light Emitting Diode

An organic light emitting diode was manufactured in the same manner as in Example 1 except that Compound 41 was used instead of Compound 2.

Example 9 Manufacture of Organic Light Emitting Diode

An organic light emitting diode was manufactured in the same manner as in Example 1 except that Compound 42 was used instead of Compound 2.

Example 10 Manufacture of Organic Light Emitting Diode

An organic light emitting diode was manufactured in the same manner as in Example 1 except that Compound 44 was used instead of Compound 2.

Example 11 Manufacture of Organic Light Emitting Diode

An organic light emitting diode was manufactured in the same manner as in Example 1 except that Compound 48 was used instead of Compound 2.

Example 12 Manufacture of Organic Light Emitting Diode

An organic light emitting diode was manufactured in the same manner as in Example 1 except that Compound 52 was used instead of Compound 2.

Example 13 Manufacture of Organic Light Emitting Diode

An organic light emitting diode was manufactured in the same manner as in Example 1 except that Compound 55 was used instead of Compound 2.

Example 14 Manufacture of Organic Light Emitting Diode

An organic light emitting diode was manufactured in the same manner as in Example 1 except that Compound 56 was used instead of Compound 2.

Example 15 Manufacture of Organic Light Emitting Diode

An organic light emitting diode was manufactured in the same manner as in Example 1 except that Compound 57 was used instead of Compound 2.

Example 16 Manufacture of Organic Light Emitting Diode

An organic light emitting diode was manufactured in the same manner as in Example 1 except that Compound 61 was used instead of Compound 2.

Example 17 Manufacture of Organic Light Emitting Diode

An organic light emitting diode was manufactured in the same manner as in Example 1 except that Compound 69 was used instead of Compound 2.

Example 18 Manufacture of Organic Light Emitting Diode

An organic light emitting diode was manufactured in the same manner as in Example 1 except that Compound 94 was used instead of Compound 2.

Example 19 Manufacture of Organic Light Emitting Diode

An organic light emitting diode was manufactured in the same manner as in Example 1 except that Compound 100 was used instead of Compound 2.

Comparative Example 1 Manufacture of Organic Light Emitting Diode

An organic light emitting diode was manufactured in the same manner as in Example 1 except that the following Chemical Formula ET-1 was used instead of Compound 2.

[Chemical Formula ET-1]

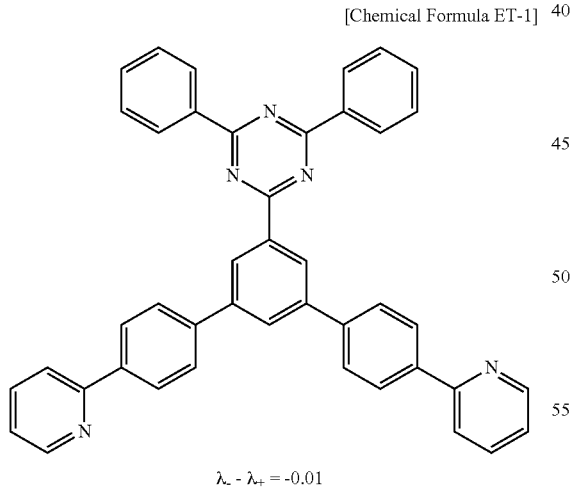

$\lambda_- - \lambda_+ = -0.01$

Comparative Example 2 Manufacture of Organic Light Emitting Diode

An organic light emitting diode was manufactured in the same manner as in Example 1 except that the following Chemical Formula ET-2 was used instead of Compound 2.

[Chemical Formula ET-2]

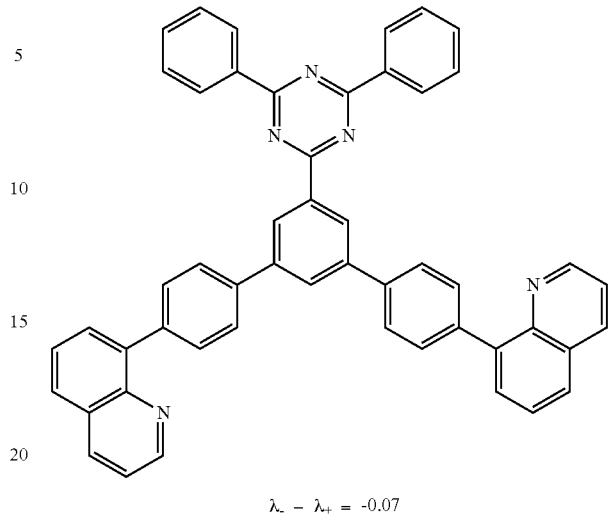

$\lambda_- - \lambda_+ = -0.07$

Comparative Example 3 Manufacture of Organic Light Emitting Diode

An organic light emitting diode was manufactured in the same manner as in Example 1 except that the following Chemical Formula ET-3 was used instead of Compound 2.

[Chemical Formula ET-3]

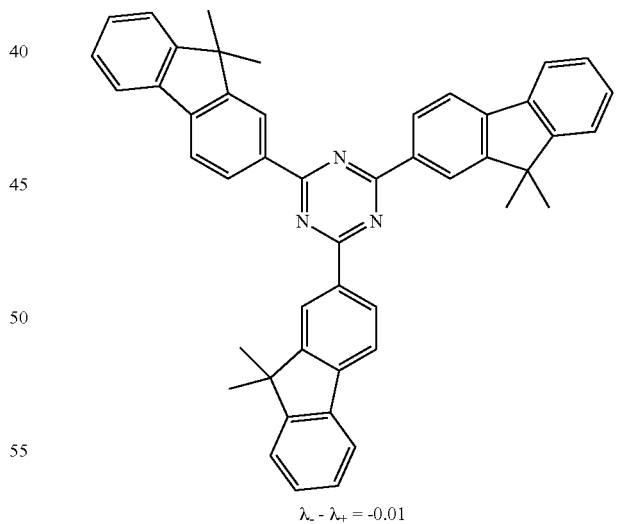

$\lambda_- - \lambda_+ = -0.01$

Comparative Example 4 Manufacture of Organic Light Emitting Diode

An organic light emitting diode was manufactured in the same manner as in Example 1 except that the following Chemical Formula ET-4 was used instead of Compound 2.

[Chemical Formula ET-4]

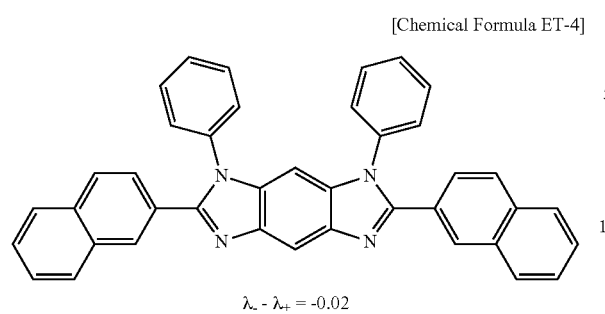

λ₋ - λ₊ = -0.02

[Chemical Formula ET-6]

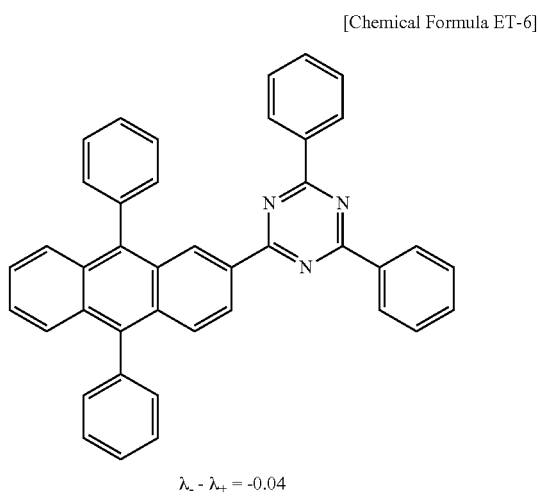 [SMILES: c1ccc(-c2nc(-c3ccccc3)nc(-c3ccc4c(-c5ccccc5)c5ccccc5c(-c5ccccc5)c4c3)n2)cc1]

λ₋ - λ₊ = -0.04

Comparative Example 5 Manufacture of Organic Light Emitting Diode

An organic light emitting diode was manufactured in the same manner as in Example 1 except that the following Chemical Formula ET-5 was used instead of Compound 2.

[Chemical Formula ET-5]

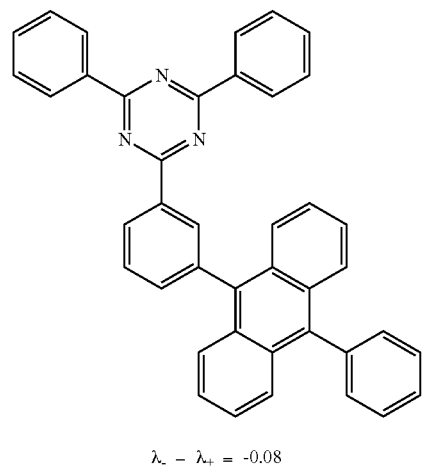

λ₋ - λ₊ = -0.08

Comparative Example 6 Manufacture of Organic Light Emitting Diode

An organic light emitting diode was manufactured in the same manner as in Example 1 except that the following Chemical Formula ET-6 was used instead of Compound 2.

Comparative Example 7 Manufacture of Organic Light Emitting Diode

An organic light emitting diode was manufactured in the same manner as in Example 1 except that the following Chemical Formula ET-7 was used instead of Compound 2.

[Chemical Formula ET-7]

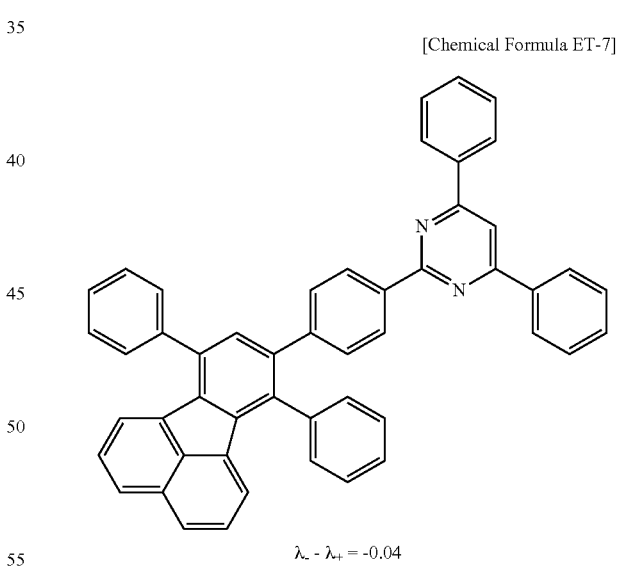

λ₋ - λ₊ = -0.04

Comparative Example 8

An organic light emitting diode was manufactured in the same manner as in Example 1 except that the following Chemical Formula ET-8 was used instead of Compound 2.

[Chemical Formula ET-8]

$\lambda_- - \lambda_+ = 0.35$

[Chemical Formula ET-10]

$\lambda_- - \lambda_+ = -0.08$

Comparative Example 9

An organic light emitting diode was manufactured in the same manner as in Example 1 except that the following Chemical Formula ET-9 was used instead of Compound 2.

[Chemical Formula ET-9]

$\lambda_- - \lambda_+ = 0.36$

Comparative Example 11

An organic light emitting diode was manufactured in the same manner as in Example 1 except that the following Chemical Formula ET-11 was used instead of Compound 2.

[Chemical Formula ET-11]

$\lambda_- - \lambda_+ = -0.1$

Comparative Example 10

An organic light emitting diode was manufactured in the same manner as in Example 1 except that the following Chemical Formula ET-10 was used instead of Compound 2.

Comparative Example 12

An organic light emitting diode was manufactured in the same manner as in Example 1 except that the following Chemical Formula ET-12 was used instead of Compound 2.

[Chemical Formula ET-12]

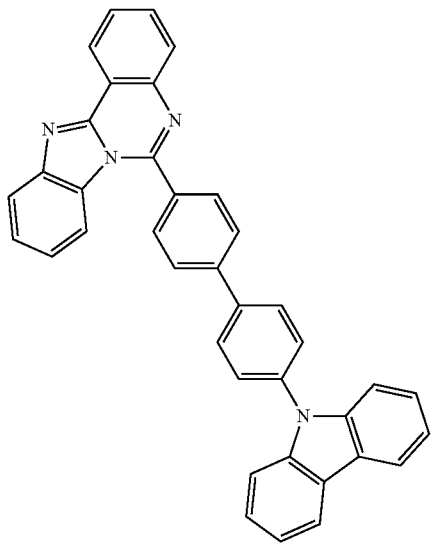

$\lambda_- - \lambda_+ = 0.46$

Comparative Example 13

An organic light emitting diode was manufactured in the same manner as in Example 1 except that the following Chemical Formula ET-13 was used instead of Compound 2.

[Chemical Formula ET-13]

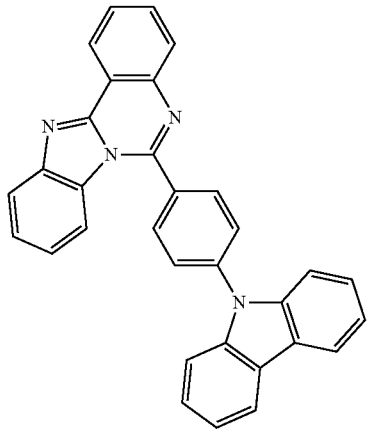

$\lambda_- - \lambda_+ = 0.45$

Comparative Example 14

An organic light emitting diode was manufactured in the same manner as in Example 1 except that the following Chemical Formula ET-14 was used instead of Compound 2.

[Chemical Formula ET-14]

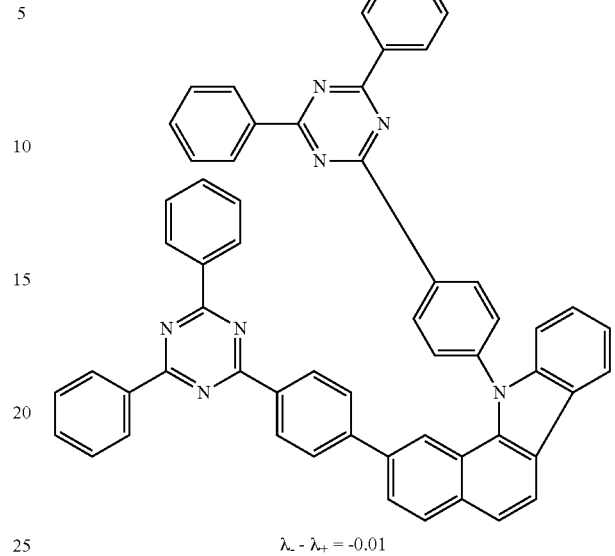

$\lambda_- - \lambda_+ = -0.01$

Comparative Example 15

An organic light emitting diode was manufactured in the same manner as in Example 1 except that the following Chemical Formula ET-15 was used instead of Compound 2.

[Chemical Formula ET-15]

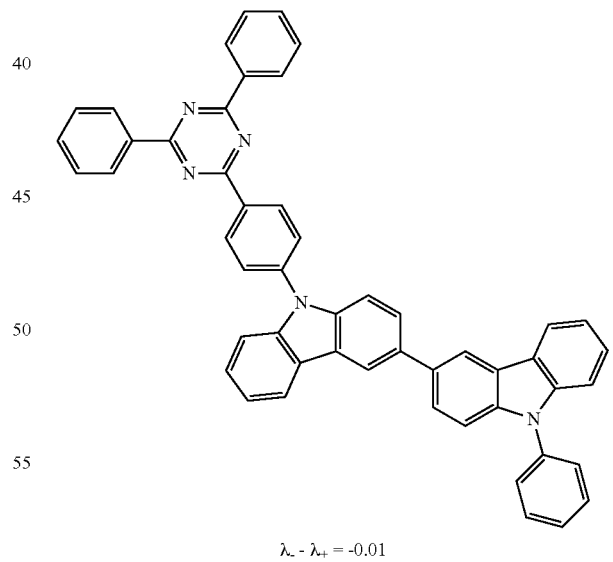

$\lambda_- - \lambda_+ = -0.01$

Comparative Example 16

An organic light emitting diode was manufactured in the same manner as in Example 1 except that the following Chemical Formula ET-16 was used instead of Compound 2.

[Chemical Formula ET-16]

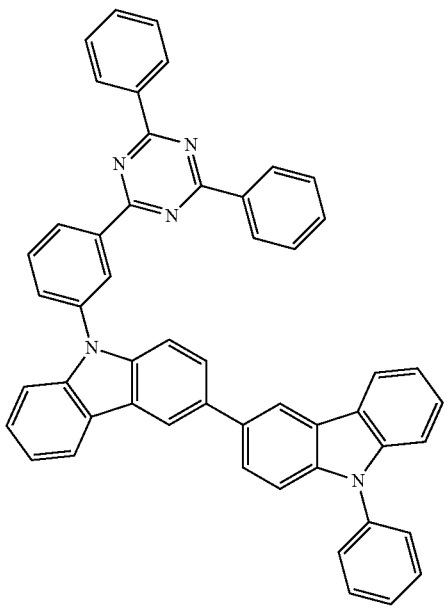

$\lambda_- - \lambda_+ = -0.02$

Comparative Example 17

An organic light emitting diode was manufactured in the same manner as in Example 1 except that Compound 2 was used instead of Chemical Formula H1 as the host material of the light emitting layer.

Comparative Example 18

An organic light emitting diode was manufactured in the same manner as in Example 1 except that Compound 13 was used instead of Chemical Formula H1 as the host material of the light emitting layer.

Comparative Example 19

An organic light emitting diode was manufactured in the same manner as in Example 1 except that Compound 35 was used instead of Chemical Formula H1 as the host material of the light emitting layer.

Comparative Example 20

An organic light emitting diode was manufactured in the same manner as in Example 1 except that Compound 39 was used instead of Chemical Formula H1 as the host material of the light emitting layer.

Comparative Example 21

An organic light emitting diode was manufactured in the same manner as in Example 1 except that Compound 56 was used instead of Chemical Formula H1 as the host material of the light emitting layer.

Comparative Example 22

An organic light emitting diode was manufactured in the same manner as in Example 1 except that Compound 57 was used instead of Chemical Formula H1 as the host material of the light emitting layer.

Comparative Example 23

An organic light emitting diode was manufactured in the same manner as in Example 1 except that Compound 61 was used instead of Chemical Formula H1 as the host material of the light emitting layer.

Comparative Example 24

An organic light emitting diode was manufactured in the same manner as in Comparative Example 1 except that Compound 2 was used instead of Chemical Formula H1 as the host material of the light emitting layer.

Comparative Example 25

An organic light emitting diode was manufactured in the same manner as in Comparative Example 1 except that Compound 13 was used instead of Chemical Formula H1 as the host material of the light emitting layer.

Comparative Example 26

An organic light emitting diode was manufactured in the same manner as in Comparative Example 1 except that Compound 35 was used instead of Chemical Formula H1 as the host material of the light emitting layer.

Comparative Example 27

An organic light emitting diode was manufactured in the same manner as in Comparative Example 1 except that Compound 39 was used instead of Chemical Formula H1 as the host material of the light emitting layer.

Comparative Example 28

An organic light emitting diode was manufactured in the same manner as in Comparative Example 1 except that Compound 56 was used instead of Chemical Formula H1 as the host material of the light emitting layer.

Comparative Example 29

An organic light emitting diode was manufactured in the same manner as in Comparative Example 1 except that Compound 57 was used instead of Chemical Formula H1 as the host material of the light emitting layer.

Comparative Example 30

An organic light emitting diode was manufactured in the same manner as in Comparative Example 1 except that Compound 61 was used instead of Chemical Formula H1 as the host material of the light emitting layer.

For the organic light emitting diodes manufactured using the above-mentioned methods, a driving voltage and light emission efficiency at current density of 10 mA/cm$^2$ were measured, and a time at which brightness becomes 98% of its initial brightness at current density of 20 mA/cm² (LT98) was measured. The results are shown in the following Table 2.

TABLE 2

| | Voltage (V) | Current Efficiency (cd/A) | Color Coordinates (x, y) | Life Time 98 at 20 mA/cm² |
|---|---|---|---|---|
| Example 1 | 3.98 | 5.66 | (0.137, 0.142) | 43 |
| Example 2 | 4.18 | 5.78 | (0.138, 0.142) | 59 |
| Example 3 | 4.1 | 5.65 | (0.138, 0.143) | 44 |
| Example 4 | 4.02 | 5.78 | (0.139, 0.143) | 35 |
| Example 5 | 3.89 | 5.88 | (0.138, 0.142) | 43 |
| Example 6 | 4.01 | 5.71 | (0.139, 0.142) | 52 |
| Example 7 | 4.01 | 5.58 | (0.138, 0.142) | 41 |
| Example 8 | 3.98 | 5.65 | (0.138, 0.143) | 48 |
| Example 9 | 4.11 | 5.64 | (0.138, 0.142) | 42 |
| Example 10 | 3.99 | 5.79 | (0.138, 0.143) | 41 |
| Example 11 | 4.07 | 5.66 | (0.138, 0.142) | 38 |
| Example 12 | 4.01 | 5.66 | (0.139, 0.142) | 51 |
| Example 13 | 4.01 | 5.65 | (0.139, 0.142) | 49 |
| Example 14 | 3.71 | 5.15 | (0.138, 0.142) | 35 |
| Example 15 | 4.04 | 5.79 | (0.138, 0.142) | 42 |
| Example 16 | 4 | 5.56 | (0.138, 0.142) | 71 |
| Example 17 | 4.02 | 5.64 | (0.138, 0.142) | 49 |
| Example 18 | 4.09 | 5.51 | (0.138, 0.142) | 55 |
| Example 19 | 4 | 5.57 | (0.138, 0.142) | 70 |
| Comparative Example 1 | 4.35 | 5.15 | (0.138, 0.142) | 28 |
| Comparative Example 2 | 4.51 | 5.05 | (0.138, 0.142) | 22 |
| Comparative Example 3 | 4.41 | 5.21 | (0.138, 0.142) | 11 |
| Comparative Example 4 | 4.33 | 4.99 | (0.138, 0.143) | 22 |
| Comparative Example 5 | 4.43 | 5.11 | (0.138, 0.141) | 27 |
| Comparative Example 6 | 4.28 | 5.25 | (0.137, 0.142) | 30 |
| Comparative Example 7 | 4.39 | 5.16 | (0.138, 0.142) | 28 |
| Comparative Example 8 | 4.29 | 5.05 | (0.139, 0.142) | 5 |
| Comparative Example 9 | 4.24 | 4.84 | (0.138, 0.142) | 26 |
| Comparative Example 10 | 4.19 | 5.06 | (0.138, 0.142) | 22 |
| Comparative Example 11 | 4.31 | 5.03 | (0.138, 0.141) | 20 |
| Comparative Example 12 | 4.24 | 4.79 | (0.138, 0.142) | 20 |
| Comparative Example 13 | 4.3 | 4.89 | (0.138, 0.141) | 23 |
| Comparative Example 14 | 4.48 | 5.01 | (0.137, 0.142) | 15 |
| Comparative Example 15 | 4.39 | 5.06 | (0.138, 0.142) | 19 |
| Comparative Example 16 | 4.19 | 5.15 | (0.139, 0.142) | 9 |
| Comparative Example 17 | 4 | 5.05 | (0.138, 0.142) | 18 |
| Comparative Example 18 | 4.05 | 5.21 | (0.139, 0.142) | 19 |
| Comparative Example 19 | 4.04 | 5.25 | (0.138, 0.142) | 7 |
| Comparative Example 20 | 4.03 | 5.22 | (0.138, 0.142) | 15 |
| Comparative Example 21 | 4.42 | 4.14 | (0.138, 0.152) | 12 |
| Comparative Example 22 | 4.5 | 3.05 | (0.138, 0.146) | 15 |
| Comparative Example 23 | 5.11 | 4.05 | (0.138, 0.144) | 16 |
| Comparative Example 24 | 5.01 | 3.98 | (0.138, 0.142) | 11 |
| Comparative Example 25 | 4.51 | 4.02 | (0.138, 0.142) | 20 |
| Comparative Example 26 | 4.64 | 4.24 | (0.138, 0.142) | 23 |
| Comparative Example 27 | 4.6 | 5.05 | (0.138, 0.142) | 8 |
| Comparative Example 28 | 4.75 | 5.03 | (0.138, 0.141) | 14 |
| Comparative Example 29 | 4.55 | 5.01 | (0.138, 0.142) | 15 |
| Comparative Example 30 | 4.32 | 4.74 | (0.138, 0.142) | 18 |

According to one embodiment of the present specification, the bipolar type compound included in the compound of Chemical Formula 1 was stable in oxidized and reduced states, and therefore, excellent efficiency may be expected in an organic light emitting diode. However, even for the compound included in Chemical Formula 1, an organic light emitting diode emitting fluorescent light, particularly, an organic light emitting diode including a light emitting layer emitting blue fluorescent light needs to additionally satisfy Equation 1.

As seen in the results of Examples 1 to 19 and Comparative Examples 1 to 16 of Table 2, it can be identified that, even for those in the scope of compounds represented by Chemical Formula 1, the compounds satisfying the value of Equation 1 provides a low driving voltage and high current efficiency in the same or a similar color coordinate range, and particularly, provides an organic light emitting diode having a long lifespan compared to the compounds that do not satisfy the value of Equation 1.

In addition, with the results of Comparative Examples 17 to 30, it can be identified that the compounds satisfying Equation 1 exhibit effects in terms of a voltage, efficiency and/or a lifespan in an organic light emitting diode when the compounds are provided between a cathode and a light emitting layer.

This is due to the fact that, when the value of Equation 1 is greater than 0 eV, efficiency of an organic light emitting diode increases without having a hole blocking layer by controlling the amount of electrons transferred from a cathode to a light emitting layer using a charge barrier that molecules themselves have, however, when the value of Equation 1 is greater than 3 eV, an energy barrier to overcome in electron transfer from a cathode becomes too high causing the amount of electrons transferred to the light emitting layer becoming too small, and this decreases the formation of excitons made by the encounter of the hole-electron pair and thereby decreases efficiency of the organic light emitting diode.

Accordingly, when an organic material layer including the compound satisfying Equation 1 according to one embodiment of the present specification is provided between a light emitting layer and a cathode, an organic light emitting diode having high efficiency and/or a long lifespan may be provided.

The invention claimed is:
1. An organic light emitting diode comprising:
   an anode;
   a cathode;
   a light emitting layer provided between the anode and the cathode; and
   an organic material layer provided between the cathode and the light emitting layer,
   wherein the light emitting layer includes a fluorescent dopant; and the organic material layer provided between the cathode and the light emitting layer includes a compound satisfying the following Equation 1, wherein the organic material layer is an electron transfer layer, an electron injection layer or a layer carrying out electron transfer and electron injection at the same time:

$$0 \text{ eV} < \lambda_- - \lambda_+ < 0.3 \text{ eV} \quad \text{[Equation 1]}$$

wherein, in Equation 1, $\lambda_-$ means a reorientation energy value of an anion radical;

$\lambda_+$ means a reorientation energy value of a cation radical, and wherein the compound satisfying Equation 1 is represented by the following Chemical Formula 1:

$$\text{Het-L-D1} \quad \text{[Chemical Formula 1]}$$

wherein, in Chemical Formula 1,

Het is any one of the following structures:

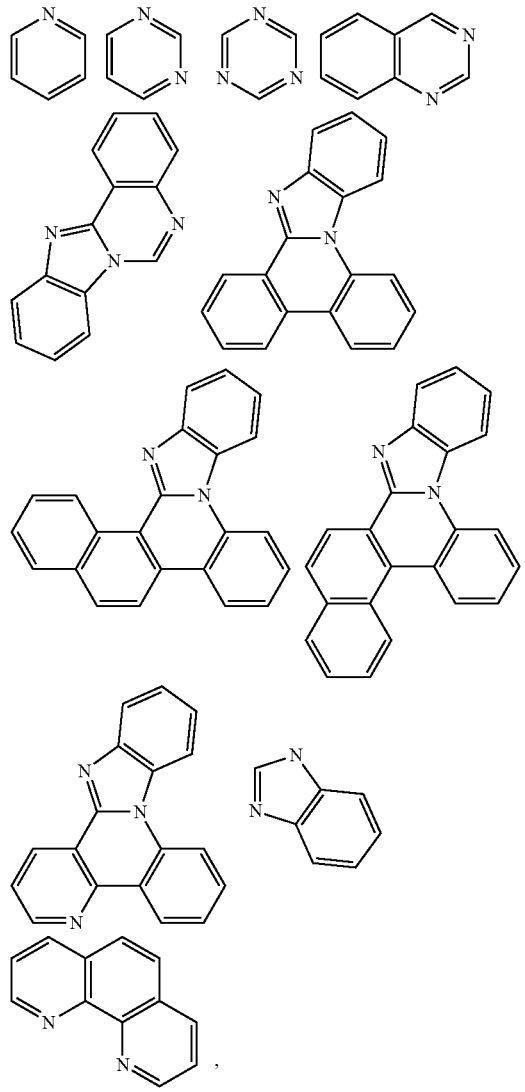

wherein Het is unsubstituted or substituted with one, two or more substituents selected from the group consisting of deuterium, a cyano group, a substituted or unsubstituted alkyl group, a substituted or unsubstituted aryl group, and a substituted or unsubstituted heteroring group, L is a direct bond, a substituted or unsubstituted phenylene group, a substituted or unsubstituted biphenylene group, a substituted or unsubstituted terphenylene group, or a substituted or unsubstituted naphthylene group, D1 is any one of the following structures:

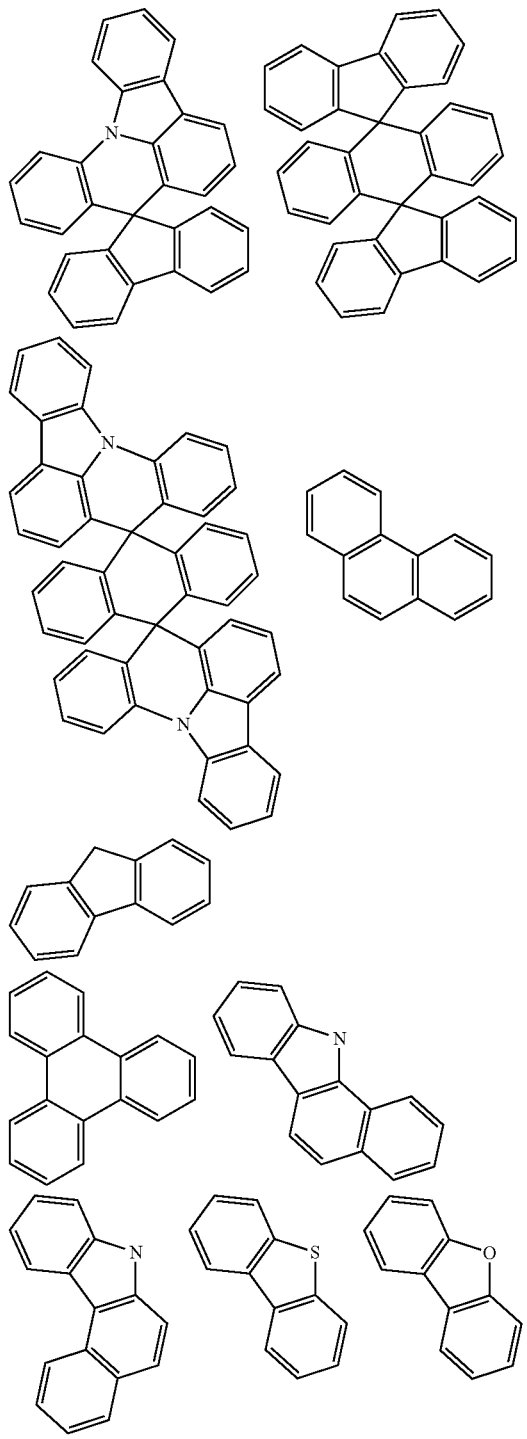

-continued

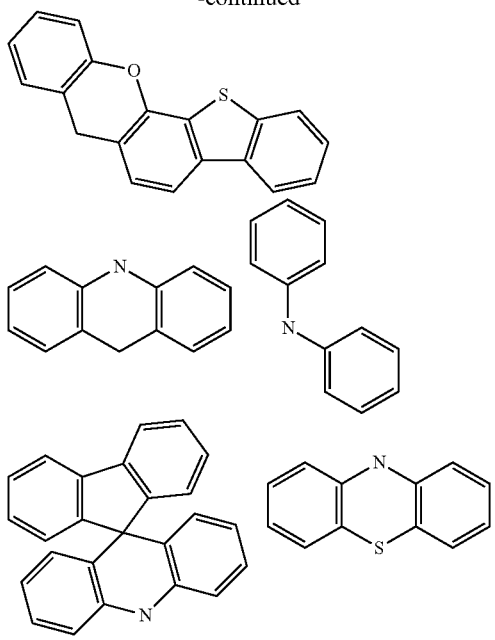

wherein D1 is unsubstituted or substituted with one, two or more substituents selected from the group consisting of deuterium, a substituted or unsubstituted alkyl group, a substituted or unsubstituted aryl group, and a substituted or unsubstituted heteroring group, with the proviso that when Het is

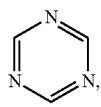

D1 is not one of

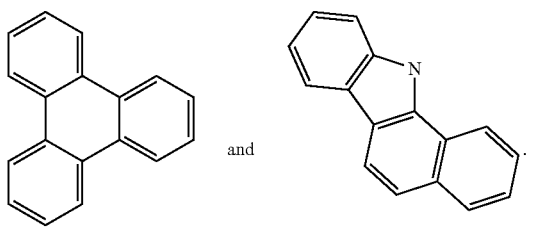

2. The organic light emitting diode of claim 1, wherein an ionization potential value of the compound satisfying Equation 1 is greater than or equal to 5.5 eV and less than 6.5 eV.

3. The organic light emitting diode of claim 1, which satisfies the following Equation 2:

|ΔIP|<0.5 eV      [Equation 2]

wherein, in Equation 2,

ΔIP means a difference between an ionization potential value of the compound satisfying Equation 1 and an ionization potential value of a host material of the light emitting layer.

4. The organic light emitting diode of claim 1, wherein electron mobility of the compound satisfying Equation 1 is $10^{-7}$ cm$^2$/Vs or greater under an electric field condition of 0.1 MV/cm.

5. The organic light emitting diode of claim 1, wherein hole mobility of the compound satisfying Equation 1 is $10^{-7}$ cm$^2$/Vs or greater under an electric field condition of 0.1 MV/cm.

6. The organic light emitting diode of claim 1, which emits blue fluorescent light.

7. The organic light emitting diode of claim 1, wherein the light emitting layer includes a peak wavelength of an optical emission spectrum of 550 nm or less.

8. The organic light emitting diode of claim 1, wherein the organic material layer including the compound satisfying Equation 1 is provided adjoining the light emitting layer.

9. An organic light emitting diode comprising:

an anode;

a cathode;

a light emitting layer provided between the anode and the cathode; and an organic material layer provided between the cathode and the light emitting layer, wherein the light emitting layer includes a fluorescent dopant; and the organic material layer provided between the cathode and the light emitting layer includes a compound satisfying the following Equation 1, wherein the organic material layer is an electron transfer layer, an electron injection layer or a layer carrying out electron transfer and electron injection at the same time:

$$0\ eV < \lambda_- - \lambda_+ < 0.3\ eV \quad \text{[Equation 1]}$$

wherein, in Equation 1,

λ− means a reorientation energy value of an anion radical;

λ+ means a reorientation energy value of a cation radical, and wherein the compound satisfying Equation 1 is represented by any one of the following Compound 1 to 39, 43 to 48, 50 to 55, 62, 64 to 67, 69, 77, 79 to 92 and 94 to 97:

Compound 1

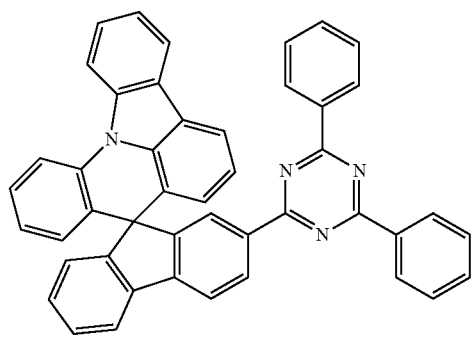

Compound 2
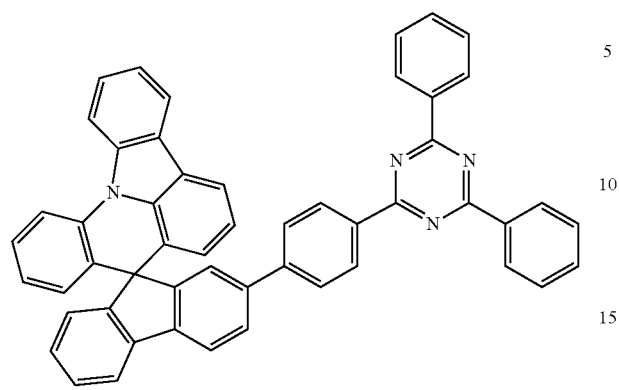
Compound 3
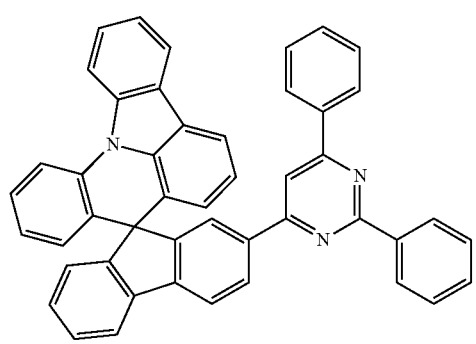
Compound 4
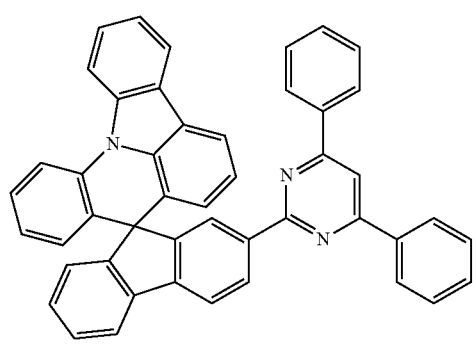
Compound 5
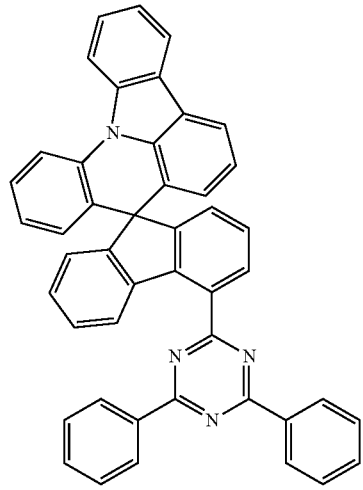
Compound 6
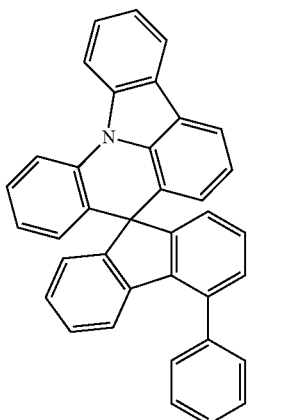
Compound 7
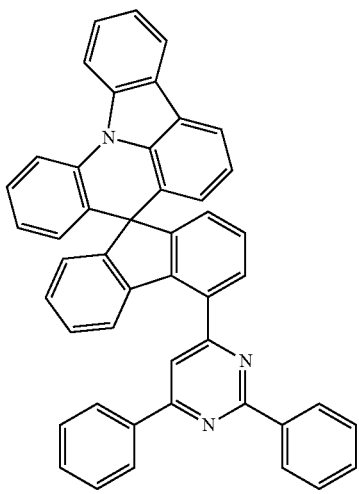
Compound 8
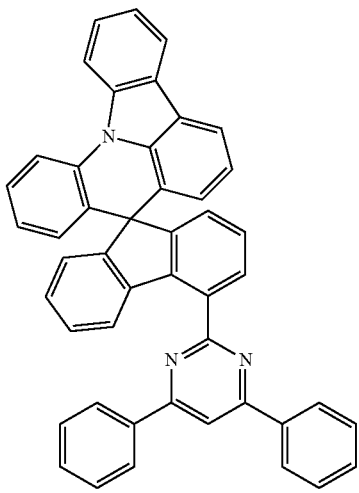

Compound 9
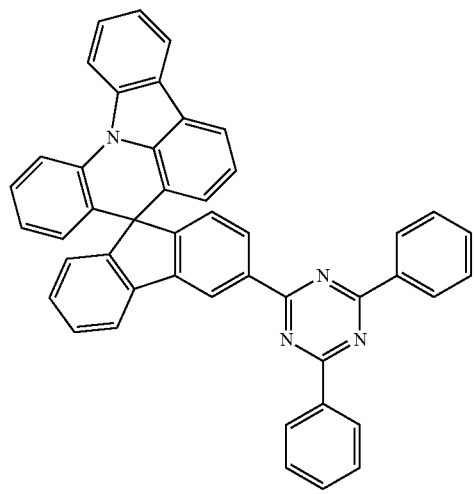
Compound 12
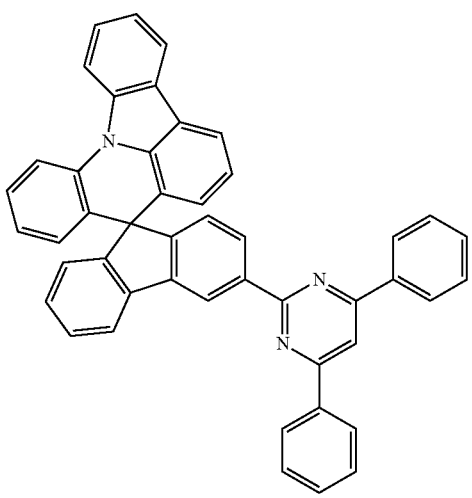
Compound 10
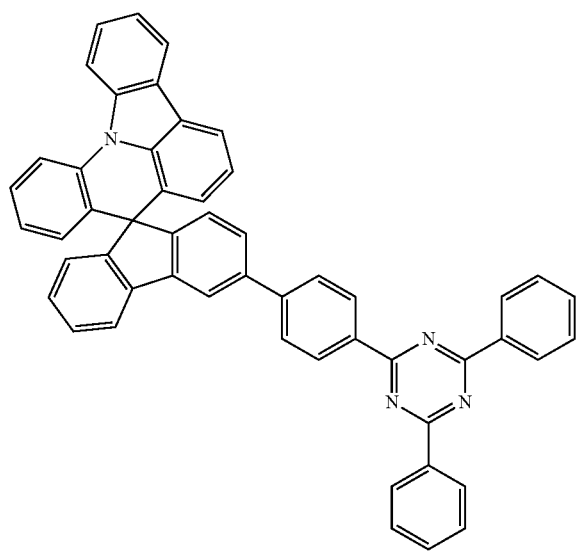
Compound 13
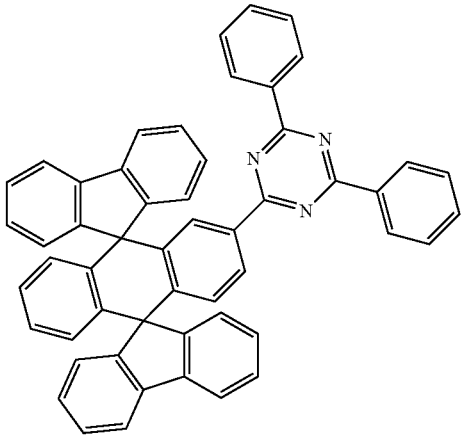
Compound 11
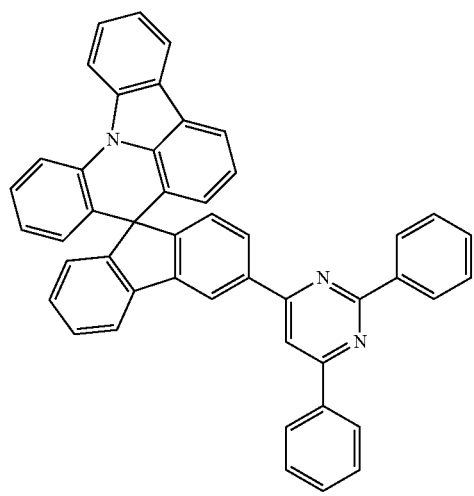
Compound 14
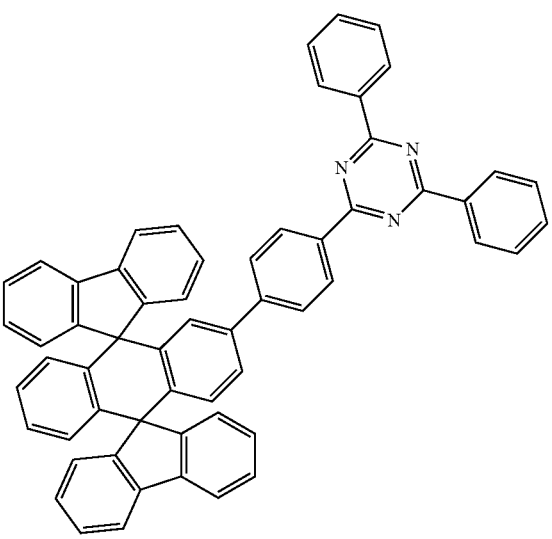

Compound 15
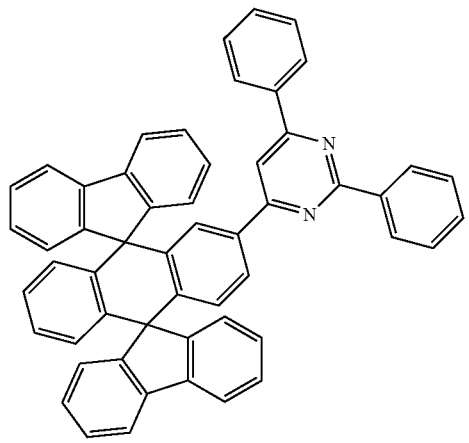
Compound 16
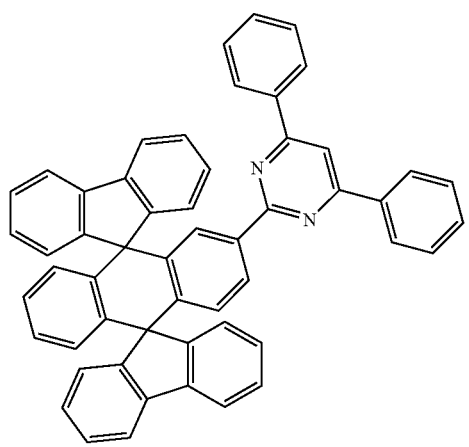
Compound 17
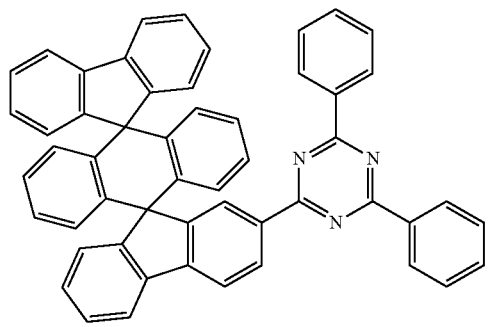
Compound 18
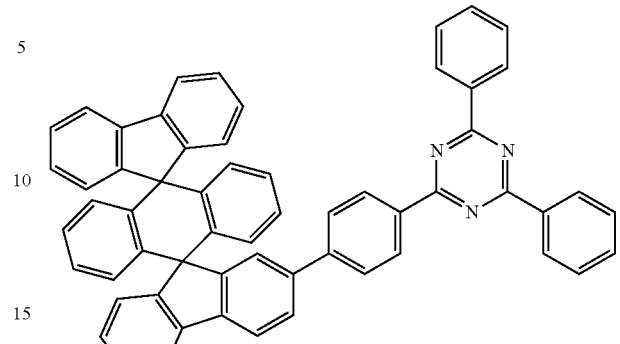
Compound 19
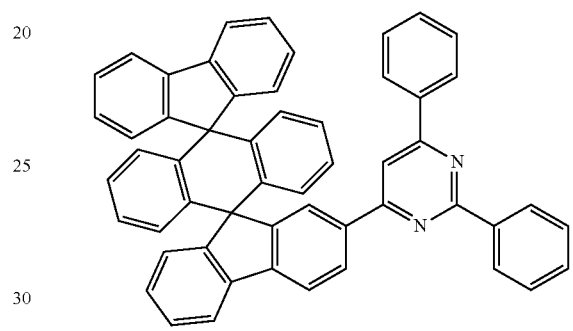
Compound 20
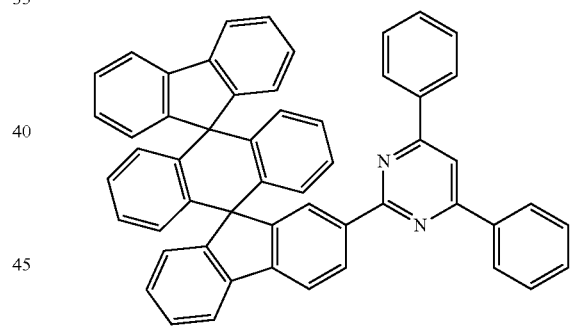
Compound 21
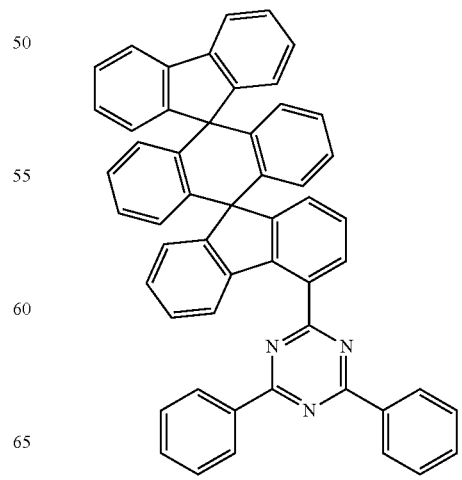

Compound 22
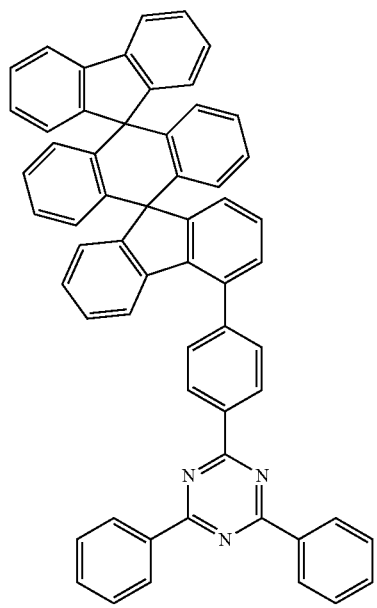
Compound 23
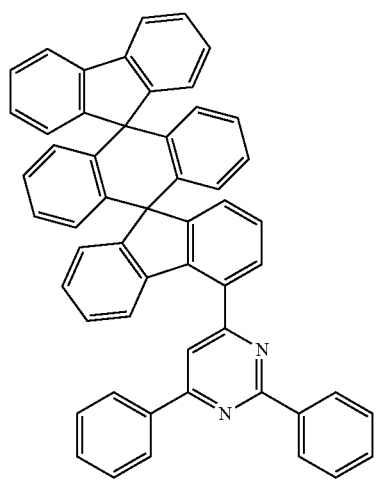
Compound 24
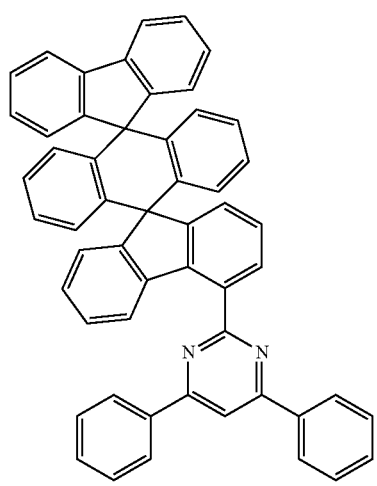
Compound 25
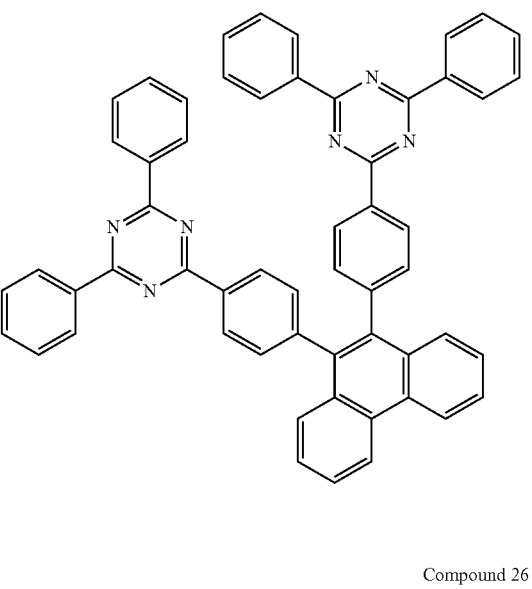
Compound 26
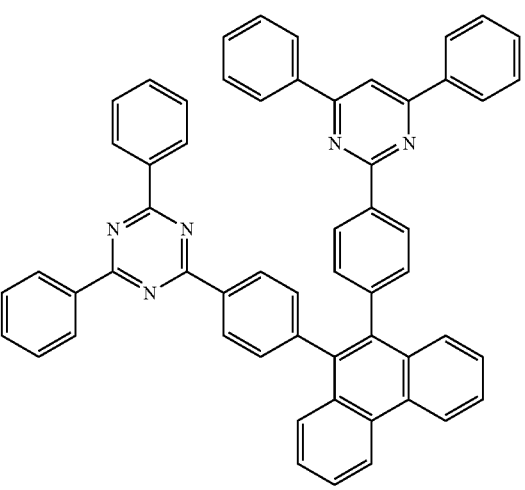
Compound 27
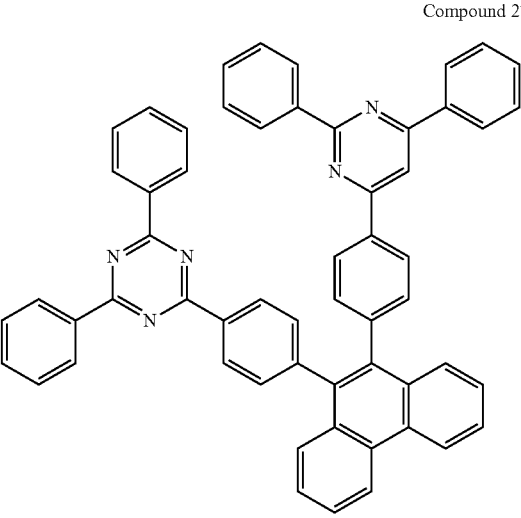

Compound 28
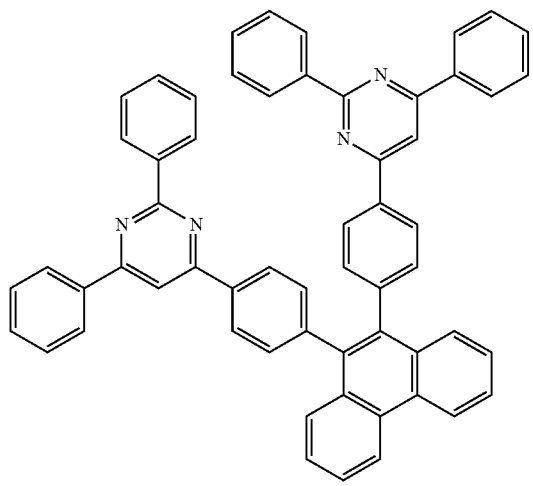
Compound 29
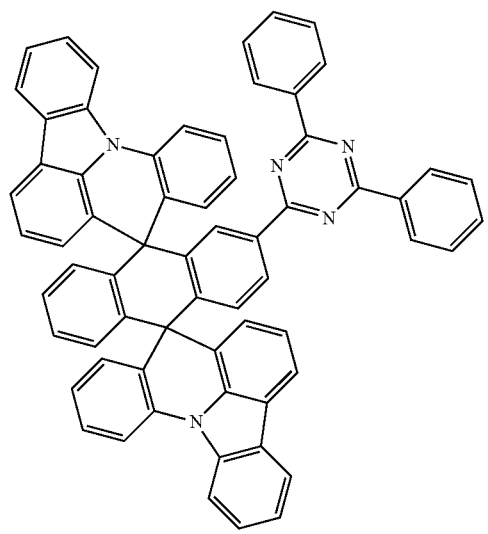
Compound 30
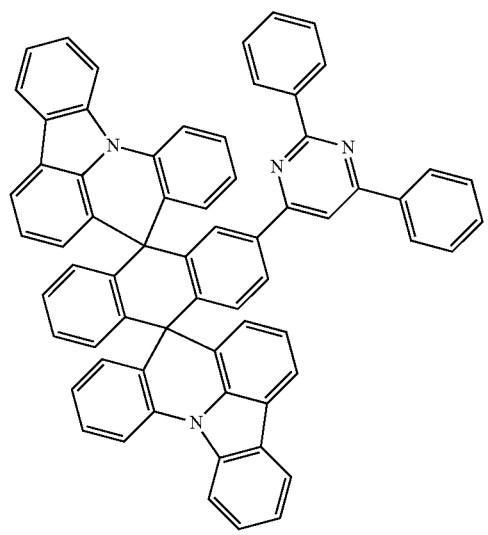
Compound 31
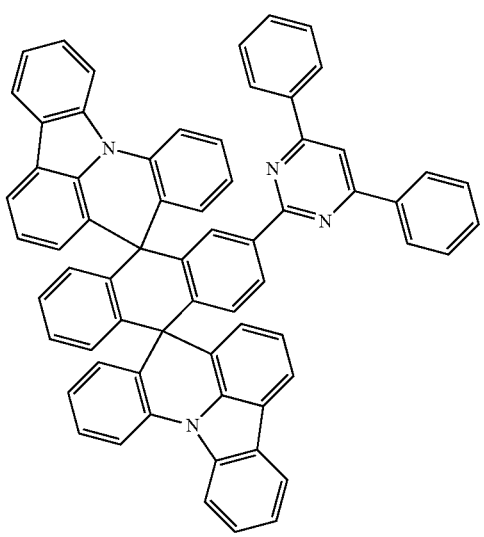
Compound 32
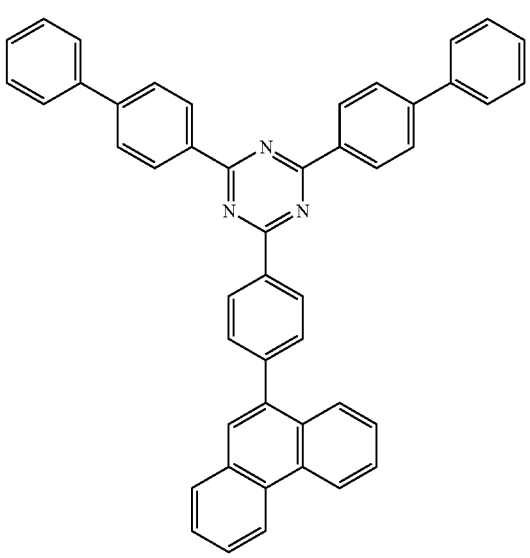
Compound 33
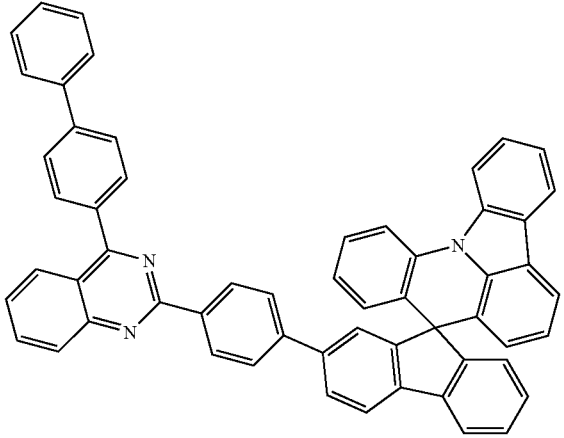

Compound 34
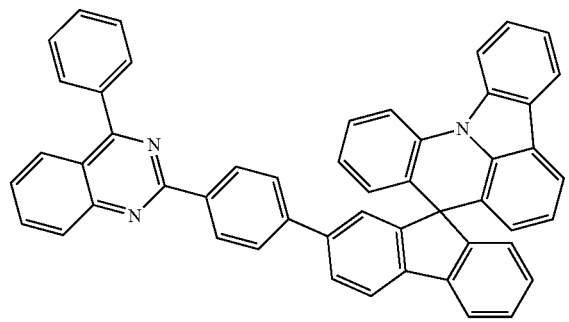
Compound 35
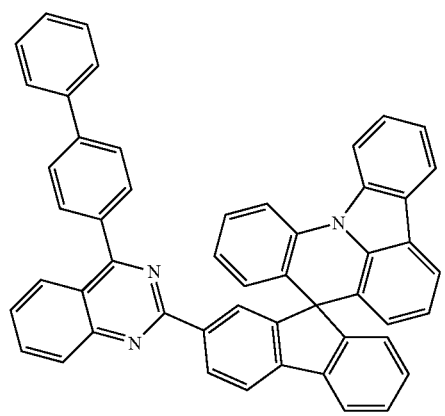
Compound 36
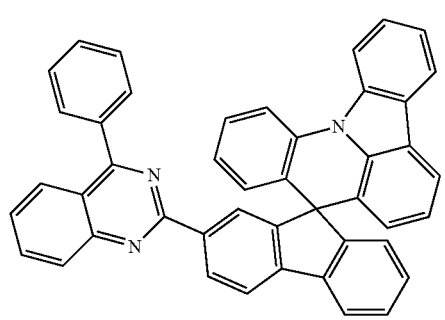
Compound 37
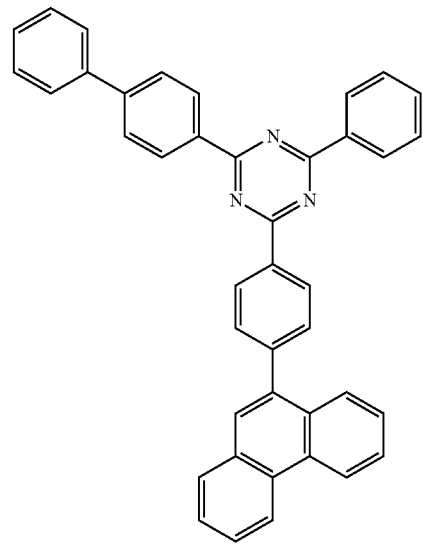
Compound 38
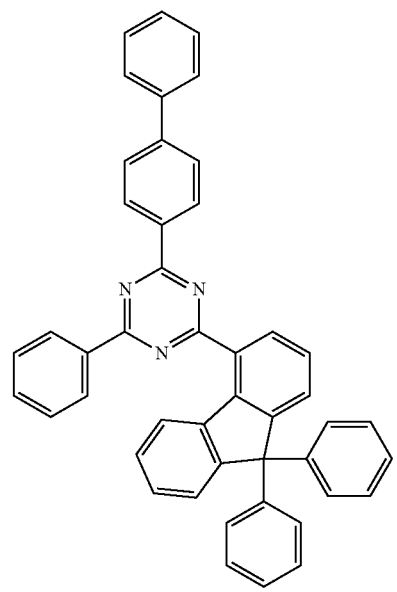
Compound 39
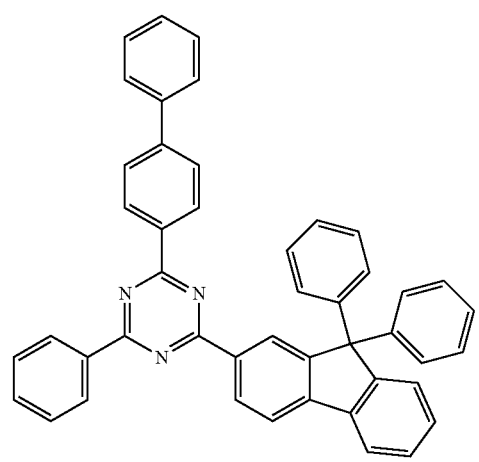

Compound 43
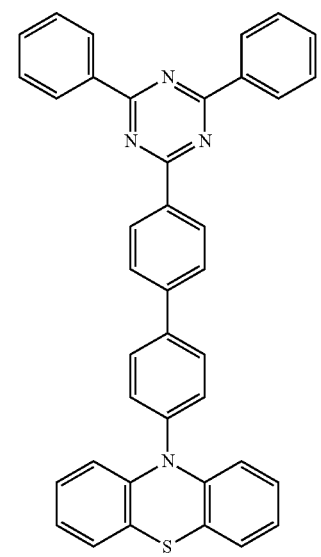
Compound 44
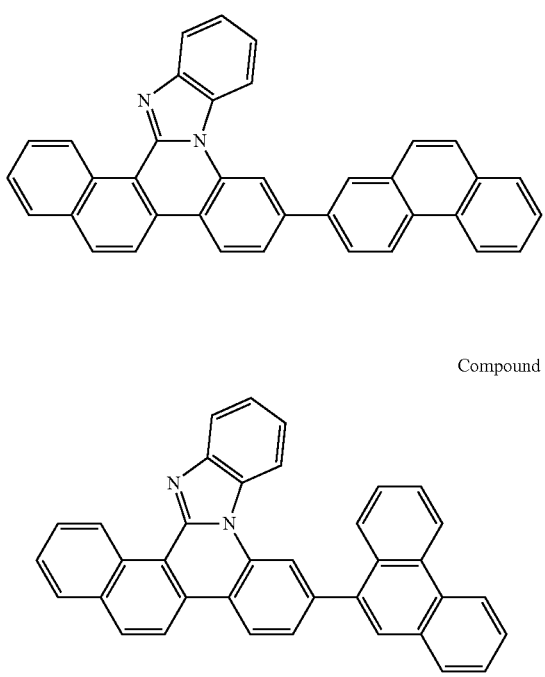
Compound 45
Compound 46
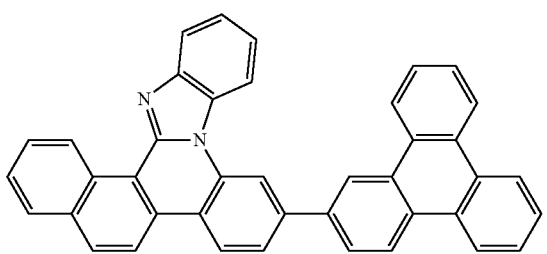
Compound 47
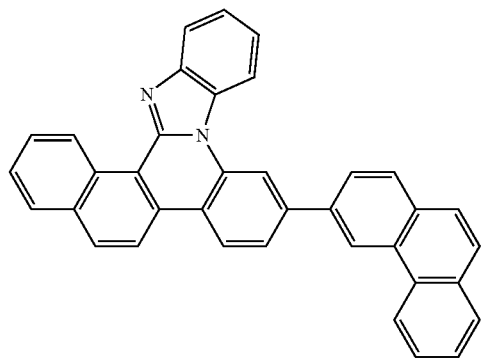
Compound 48
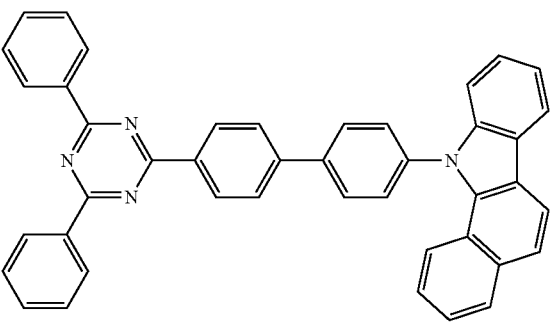
Compound 50
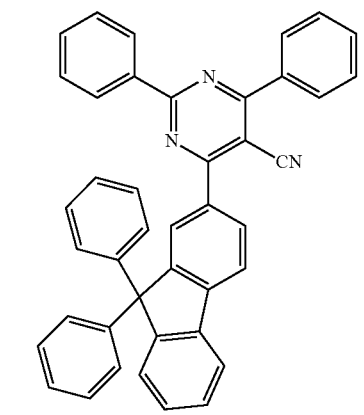
Compound 51
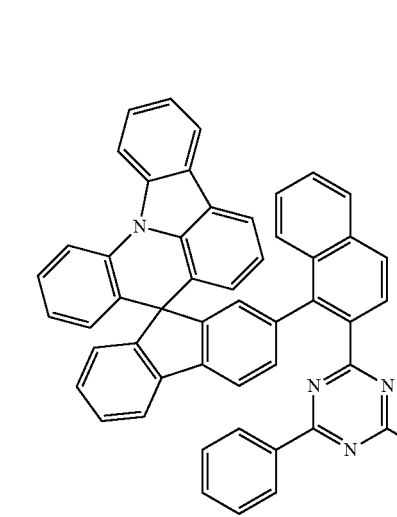

Compound 52
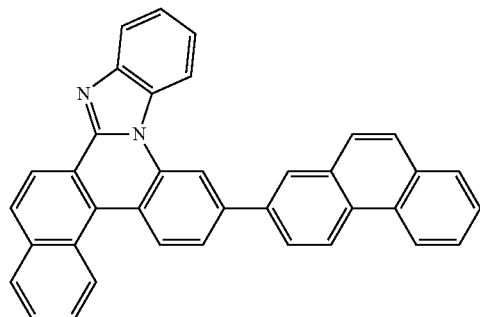
Compound 55
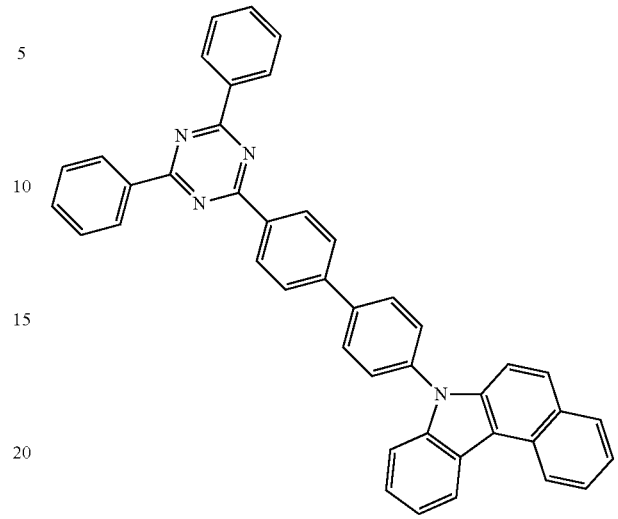
Compound 53
Compound 62
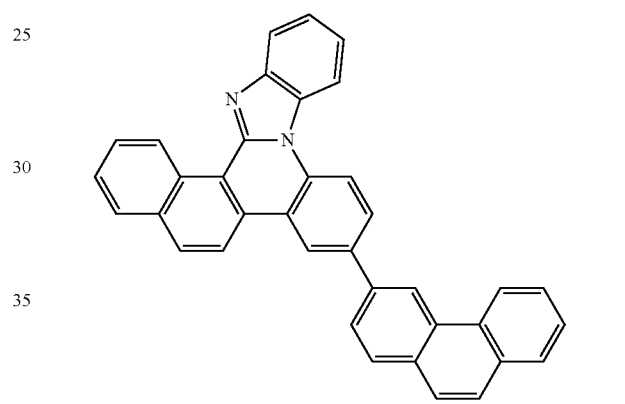
Compound 64
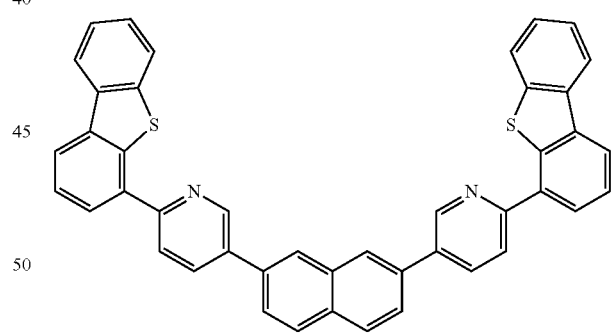
Compound 54
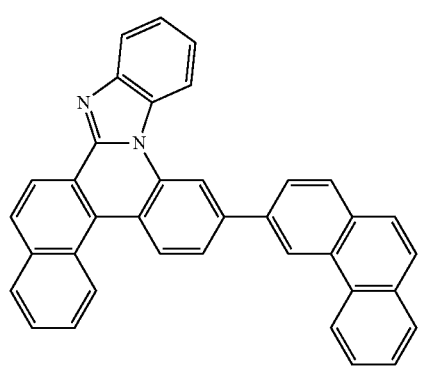
Compound 65
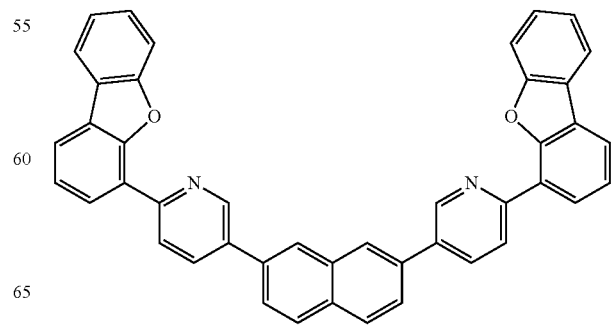

Compound 66
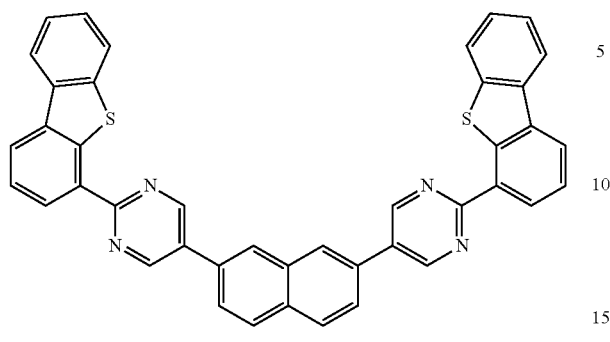
Compound 67
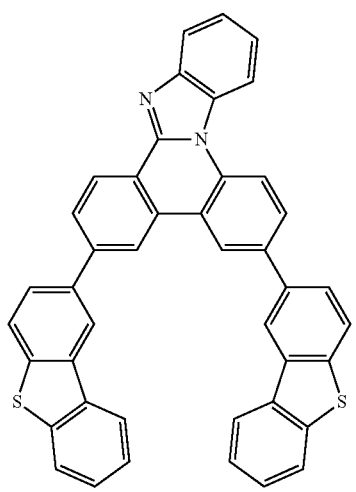
Compound 69
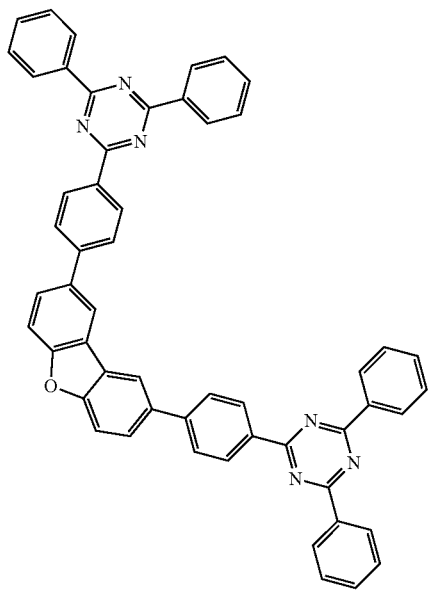
Compound 77
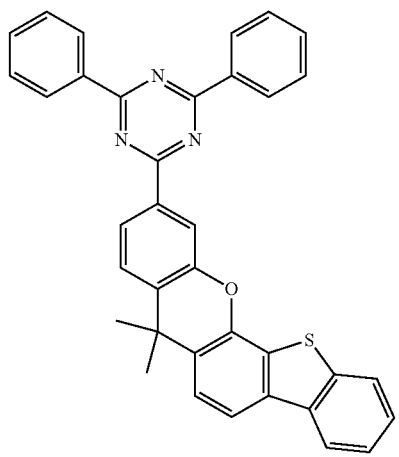
Compound 79
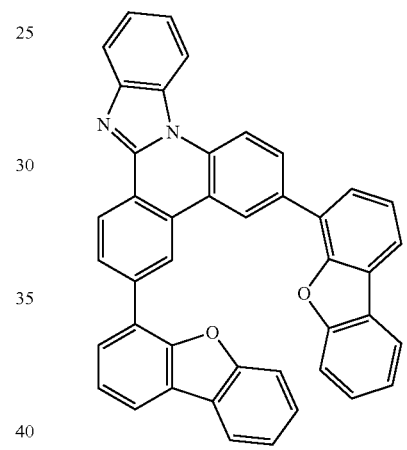
Compound 80
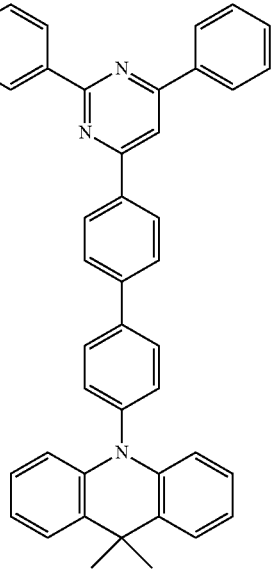

Compound 81
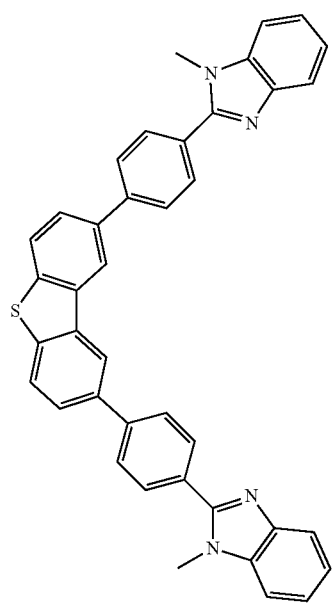
Compound 82
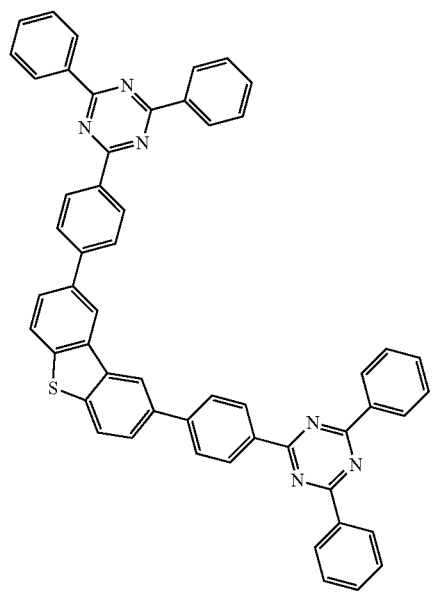
Compound 83
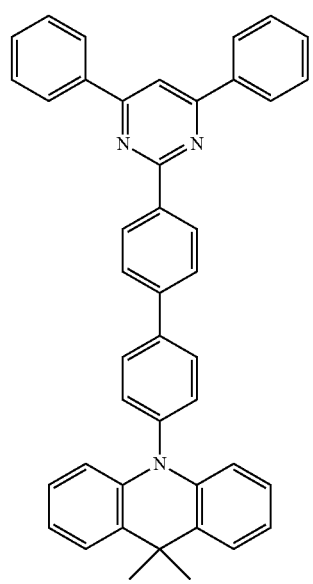
Compound 84
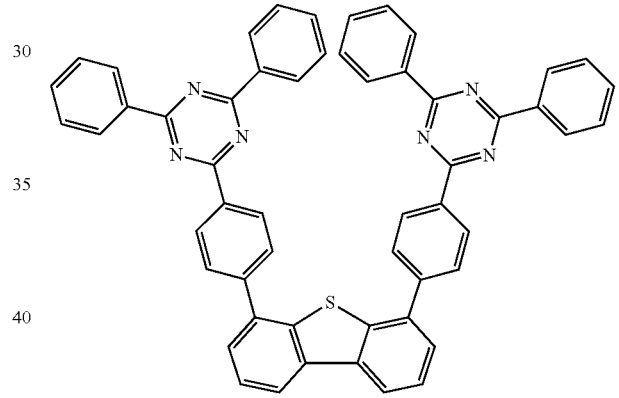
Compound 85
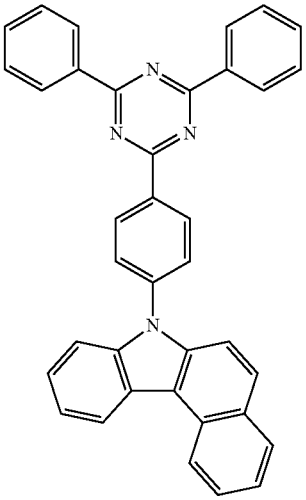

Compound 86
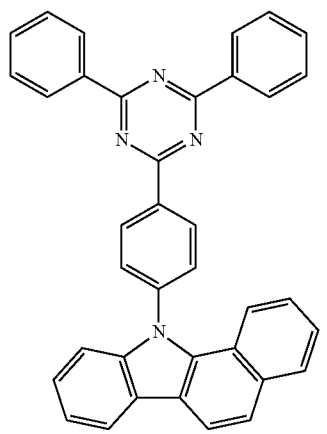
Compound 87
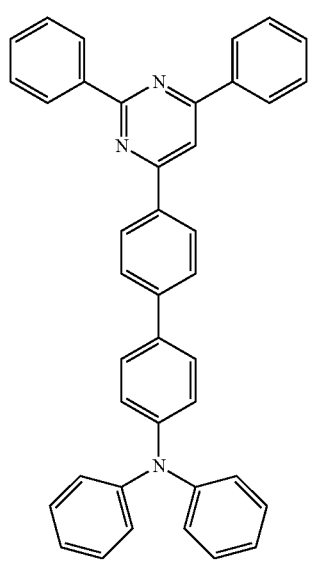
Compound 88
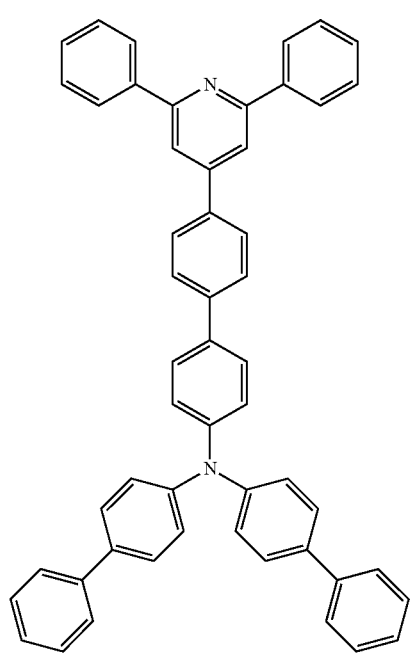
Compound 89
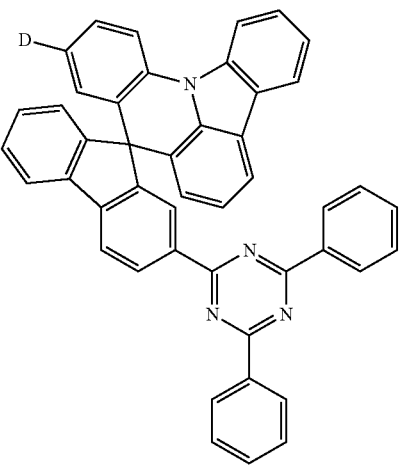
Compound 90
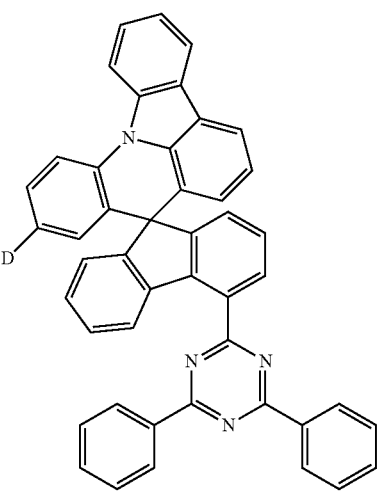
Compound 91
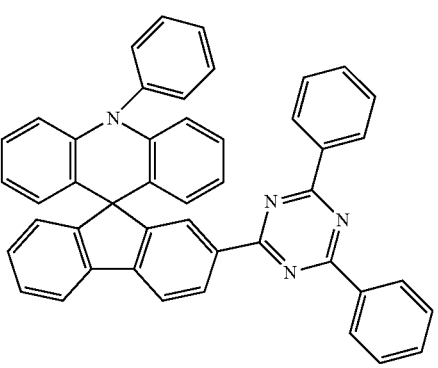

Compound 92
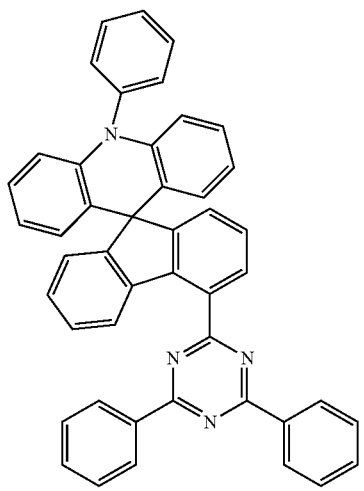
Compound 94
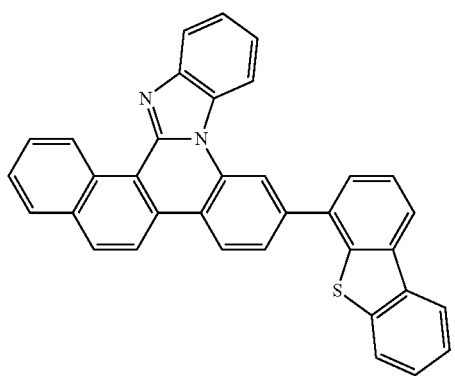
Compound 95
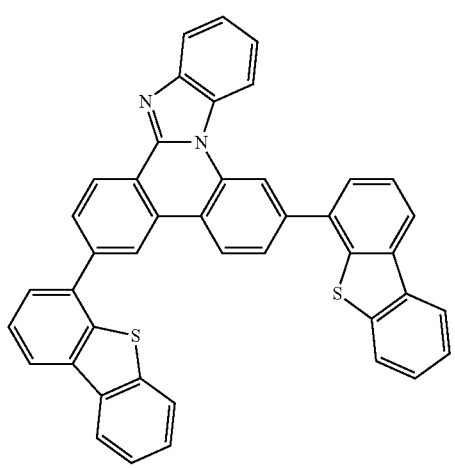
Compound 96
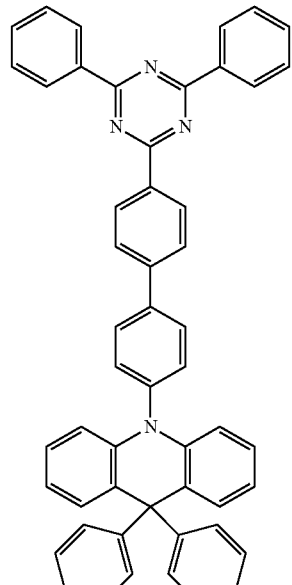
Compound 97
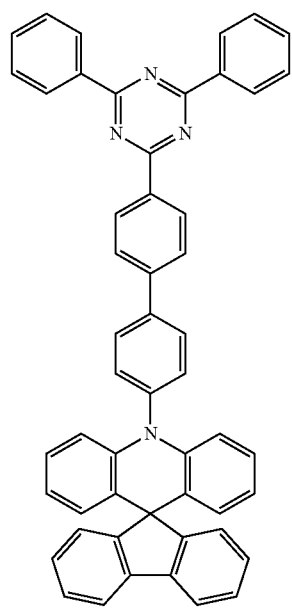
10. The organic light emitting diode of claim 1 further comprising one, two or more layers selected from the group consisting of a hole injection layer, a hole transfer layer, an electron transfer layer, an electron injection layer, an electron blocking layer and a hole blocking layer.
* * * * *